United States Patent
Song et al.

(10) Patent No.: US 10,772,242 B2
(45) Date of Patent: *Sep. 8, 2020

(54) INVERTER MODULE OF AN ELECTRIC VEHICLE

(71) Applicant: SF Motors, Inc., Santa Clara, CA (US)

(72) Inventors: Yunan Song, Santa Clara, CA (US); Kangwei Mao, Santa Clara, CA (US); Jinzhu Li, Santa Clara, CA (US); Colin Haag, Santa Clara, CA (US); Nathan Chung, Santa Clara, CA (US); Zhong Nie, Santa Clara, CA (US); Duanyang Wang, Santa Clara, CA (US); Yifan Tang, Santa Clara, CA (US)

(73) Assignees: CHONGQING JINKANG NEW ENERGY VEHICLE CO., LTD., Chongqing (CN); SF MOTORS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/110,425

(22) Filed: Aug. 23, 2018

(65) Prior Publication Data

US 2019/0320549 A1    Oct. 17, 2019

Related U.S. Application Data

(60) Provisional application No. 62/659,092, filed on Apr. 17, 2018.

(51) Int. Cl.
*H05K 7/20* (2006.01)
*H05K 7/02* (2006.01)
(Continued)

(52) U.S. Cl.
CPC ............ *H05K 7/209* (2013.01); *B60L 15/007* (2013.01); *H02M 7/003* (2013.01);
(Continued)

(58) Field of Classification Search
CPC .... H05K 7/209; H05K 5/0021; H05K 5/0026; H05K 7/20881; H05K 7/20927;
(Continued)

(56) References Cited

U.S. PATENT DOCUMENTS 3,845,661 A    11/1974    Hollweck et al.
4,382,156 A    5/1983     Jodoin
(Continued)

FOREIGN PATENT DOCUMENTS

CN    203850295         9/2014
CN    204442853 U       7/2015
(Continued)

OTHER PUBLICATIONS

Non-Final Office Action on U.S. Appl. No. 16/051,182 dated Nov. 2, 2018.
(Continued)

*Primary Examiner* — Anatoly Vortman
(74) *Attorney, Agent, or Firm* — Foley & Lardner LLP; James De Vellis

(57) ABSTRACT

Provided herein is an inverter module to power an electric vehicle. The inverter module can include a power module or multiple power modules. The power module can include a capacitor and a heat sink coupled with the capacitor. The power module can include a ceramic plate coupled with the heat sink. The power module can include a locator having a plurality of slots and a plurality of transistors disposed within the plurality of slots. The locator and the plurality of transistors can be disposed over a first surface of the ceramic plate. The power module can include a laminated bus bar disposed over a first surface of the locator. The power module can include a gate drive printed circuit board coupled with the laminated bus bar. The power module can (Continued)

include a dielectric gel tray disposed over a first surface of the gate drive printed circuit board.

20 Claims, 7 Drawing Sheets

(51) Int. Cl.
| | | |
|---|---|---|
| *H02G 5/00* | (2006.01) | |
| *H02M 7/00* | (2006.01) | |
| *H05K 5/00* | (2006.01) | |
| *H05K 9/00* | (2006.01) | |
| *H05K 3/30* | (2006.01) | |
| *H02P 27/06* | (2006.01) | |
| *H02M 7/5387* | (2007.01) | |
| *B60L 15/00* | (2006.01) | |

(52) U.S. Cl.
CPC .......... *H02M 7/5387* (2013.01); *H02P 27/06* (2013.01); *H05K 3/303* (2013.01); *H05K 5/0021* (2013.01); *H05K 5/0026* (2013.01); *H05K 7/20854* (2013.01); *H05K 7/20881* (2013.01); *H05K 7/20927* (2013.01); *H05K 7/20945* (2013.01); *H05K 9/0007* (2013.01); *B60L 2210/44* (2013.01); *H05K 2201/10015* (2013.01); *H05K 2201/10151* (2013.01); *H05K 2201/10166* (2013.01); *H05K 2201/10272* (2013.01); *H05K 2201/10393* (2013.01)

(58) Field of Classification Search
CPC ........... H05K 7/20945; H05K 7/20854; H05K 3/303; H05K 9/0007; H05K 2201/10393; H05K 2201/10151; H05K 2201/10272; H05K 2201/10166; H05K 2201/10015; H02M 7/003; H02M 7/5387; B60L 2210/44; B60L 15/007; H02P 27/06
USPC ........................................................ 361/717
See application file for complete search history.

(56) References Cited

U.S. PATENT DOCUMENTS

| | | | |
|---|---|---|---|
| 4,502,107 A | | 2/1985 | Nilssen |
| 4,584,768 A | | 4/1986 | Tosti |
| 5,365,424 A | | 11/1994 | Deam et al. |
| 5,371,043 A | | 12/1994 | Anderson et al. |
| 5,436,997 A | | 7/1995 | Makiuchi et al. |
| 5,514,906 A | | 5/1996 | Love et al. |
| 5,566,061 A | | 10/1996 | Uchino |
| 5,631,574 A | | 5/1997 | Kazama |
| 5,783,877 A | | 7/1998 | Chitayat |
| 5,804,761 A | | 9/1998 | Donegan et al. |
| 5,847,938 A | | 12/1998 | Gammon |
| 5,914,860 A | | 6/1999 | Janko |
| 6,031,751 A | | 2/2000 | Janko |
| 6,176,299 B1 | | 1/2001 | Hanzlik et al. |
| 6,272,028 B1 | | 8/2001 | Satoh et al. |
| 6,721,181 B1 | | 4/2004 | Pfeifer et al. |
| 6,822,850 B2 | | 11/2004 | Pfeifer et al. |
| 6,843,335 B2 | * | 1/2005 | Shirakawa ............ B60L 15/007 180/65.1 |
| 7,012,810 B2 | * | 3/2006 | Parkhill ................ H01L 25/072 257/E25.016 |
| 7,046,535 B2 | * | 5/2006 | Rodriguez ............ H02M 7/003 307/112 |
| 7,113,405 B2 | * | 9/2006 | Armstrong ......... H05K 7/20909 165/80.3 |
| 7,292,451 B2 | * | 11/2007 | Rodriguez ............ H02M 7/003 361/775 |
| 7,505,294 B2 | | 3/2009 | Ahmed et al. |
| 7,551,439 B2 | | 6/2009 | Peugh et al. |
| 7,557,298 B2 | | 7/2009 | Vanhoutte et al. |
| 7,714,230 B2 | | 5/2010 | Beulque |
| 7,742,303 B2 | | 6/2010 | Azuma et al. |
| 7,742,307 B2 | | 6/2010 | Ellsworth et al. |
| 7,777,433 B2 | * | 8/2010 | Yamaguchi ........... H02M 7/003 318/139 |
| 7,940,526 B2 | | 5/2011 | Schulz-Harder et al. |
| 7,965,510 B2 | * | 6/2011 | Suzuki .................. B60K 6/365 165/80.4 |
| 7,969,735 B2 | * | 6/2011 | Nakatsu ................ H02M 7/003 361/699 |
| 8,059,404 B2 | * | 11/2011 | Miller ................. H05K 7/20927 165/104.33 |
| 8,391,008 B2 | | 3/2013 | Dede |
| 8,400,791 B2 | | 3/2013 | Campbell et al. |
| 8,519,561 B2 | * | 8/2013 | Azuma ................... B60L 50/11 307/9.1 |
| 8,575,882 B2 | | 11/2013 | Radosevich |
| 8,675,376 B2 | | 3/2014 | Campbell et al. |
| 8,730,672 B2 | | 5/2014 | Ebersberger et al. |
| 8,773,007 B2 | | 7/2014 | Van De Ven et al. |
| 8,780,557 B2 | | 7/2014 | Duppong et al. |
| 8,888,506 B2 | | 11/2014 | Nishimura et al. |
| 8,947,899 B2 | | 2/2015 | Savatski et al. |
| 8,952,525 B2 | * | 2/2015 | Ide .......................... H01L 23/36 257/706 |
| 9,007,767 B2 | * | 4/2015 | Nakajima ............. H02M 7/003 165/80.4 |
| 9,225,263 B2 | | 12/2015 | Radosevich |
| 9,247,679 B2 | | 1/2016 | Joshi et al. |
| 9,439,332 B2 | * | 9/2016 | Ide ..................... H05K 7/20927 |
| 9,445,526 B2 | | 9/2016 | Zhou et al. |
| 9,565,792 B2 | | 2/2017 | Ishikawa et al. |
| 9,578,788 B2 | * | 2/2017 | Tang .................. H05K 7/20254 |
| 9,647,361 B2 | | 5/2017 | Kobuchi et al. |
| 10,021,811 B2 | | 7/2018 | Schaltz et al. |
| 10,122,294 B2 | | 11/2018 | Xu et al. |
| 10,215,504 B2 | | 2/2019 | Coteus et al. |
| 10,236,786 B2 | | 3/2019 | Liu et al. |
| 10,236,791 B1 | * | 3/2019 | Chung .............. H02M 7/53871 |
| 10,263,407 B1 | | 4/2019 | Song et al. |
| 10,594,230 B2 | | 3/2020 | Chung et al. |
| 2003/0111714 A1 | | 6/2003 | Bates et al. |
| 2003/0133257 A1 | | 7/2003 | Beihoff et al. |
| 2003/0218057 A1 | | 11/2003 | Joseph et al. |
| 2004/0060692 A1 | | 4/2004 | Pfeifer et al. |
| 2004/0227231 A1 | | 11/2004 | Maly et al. |
| 2004/0228094 A1 | | 11/2004 | Ahmed et al. |
| 2006/0092611 A1 | | 5/2006 | Beihoff et al. |
| 2006/0274561 A1 | | 12/2006 | Ahmed et al. |
| 2006/0291165 A1 | | 12/2006 | Flesch et al. |
| 2007/0236883 A1 | | 10/2007 | Ruiz |
| 2007/0246351 A1 | | 10/2007 | Smola et al. |
| 2007/0252169 A1 | | 11/2007 | Tokuyama et al. |
| 2008/0247139 A1 | | 10/2008 | Stahlhut et al. |
| 2008/0316710 A1 | * | 12/2008 | Seto .................... H02M 7/003 361/704 |
| 2009/0129011 A1 | | 5/2009 | Balzano |
| 2010/0025126 A1 | * | 2/2010 | Nakatsu ................. B60L 11/00 180/65.1 |
| 2010/0026090 A1 | * | 2/2010 | Nakatsu ................. B60L 50/64 307/9.1 |
| 2010/0277868 A1 | | 11/2010 | Beaupre et al. |
| 2010/0290190 A1 | | 11/2010 | Chester et al. |
| 2012/0325447 A1 | | 12/2012 | You et al. |
| 2013/0114210 A1 | | 5/2013 | Ebersberger et al. |
| 2013/0146253 A1 | | 6/2013 | Daly |
| 2013/0146254 A1 | | 6/2013 | Jeon et al. |
| 2013/0235527 A1 | | 9/2013 | Wagner et al. |
| 2014/0133150 A1 | | 5/2014 | Pardikes et al. |
| 2014/0262177 A1 | * | 9/2014 | Tang .................. H05K 7/20254 165/169 |
| 2014/0307389 A1 | | 10/2014 | Arvelo et al. |
| 2014/0345492 A1 | | 11/2014 | Fujito et al. |
| 2014/0347817 A1 | | 11/2014 | Joshi et al. |
| 2014/0369099 A1 | * | 12/2014 | Asako ................ H02M 7/003 363/97 |

(56) References Cited

U.S. PATENT DOCUMENTS

| | | | |
|---|---|---|---|
| 2015/0003019 A1* | 1/2015 | Ide | H05K 1/0271 361/705 |
| 2015/0021756 A1 | 1/2015 | Adachi | |
| 2015/0289391 A1* | 10/2015 | Nakatsu | H05K 5/0026 361/796 |
| 2016/0155572 A1 | 6/2016 | Ramm et al. | |
| 2016/0156278 A1 | 6/2016 | Ramm et al. | |
| 2016/0183409 A1 | 6/2016 | Zhou et al. | |
| 2016/0242312 A1 | 8/2016 | Singh et al. | |
| 2017/0028869 A1 | 2/2017 | Boddakayala et al. | |
| 2017/0330815 A1 | 11/2017 | Mische et al. | |
| 2018/0184538 A1 | 6/2018 | Bayerer | |
| 2018/0184543 A1 | 6/2018 | Ando et al. | |
| 2018/0198378 A1 | 7/2018 | Xu et al. | |
| 2018/0206359 A1 | 7/2018 | McPherson et al. | |
| 2018/0330895 A1 | 11/2018 | Nagayoshi et al. | |
| 2019/0296656 A1 | 9/2019 | Chung et al. | |
| 2019/0296657 A1 | 9/2019 | Chung et al. | |
| 2019/0296658 A1 | 9/2019 | Chung et al. | |
| 2019/0335607 A1 | 10/2019 | Song et al. | |
| 2019/0335608 A1 | 10/2019 | Song et al. | |

FOREIGN PATENT DOCUMENTS

| | | | |
|---|---|---|---|
| CN | 106656021 A | 5/2017 | |
| CN | 106848118 A | 6/2017 | |
| CN | 107769604 A | 3/2018 | |

OTHER PUBLICATIONS

Notice of Allowance on U.S. Appl. No. 16/051,182 dated Jan. 3, 2019.

International Search Report and Written Opinion for International Appl. No. PCT/CN2018/125644, dated Apr. 2, 2019.

Non-Final Office Action on U.S. Appl. No. 16/051,190 dated Mar. 13, 2019.

Non-Final Office Action on U.S. Appl. No. 16/051,193 dated Apr. 9, 2019.

Non-Final Office Action on U.S. Appl. No. 16/110,425 dated Apr. 11, 2019.

Non-Final Office Action on U.S. Appl. No. 16/110,475 dated Mar. 13, 2019.

Non-Final Office Action on U.S. Appl. No. 16/110,513 dated May 13, 2019.

Non-Final Office Action on U.S. Appl. No. 16/110,559 dated Feb. 25, 2019.

Non-Final Office Action on U.S. Appl. No. 16/232,981 dated Mar. 13, 2019.

Non-Final Office Action on U.S. Appl. No. 16/233,028 dated Apr. 9, 2019.

Non-Final Office Action on U.S. Appl. No. 16/233,826 dated Apr. 11, 2019.

Non-Final Office Action on U.S. Appl. No. 16/233,842 dated Mar. 13, 2019.

Non-Final Office Action on U.S. Appl. No. 16/234,242 dated Feb. 25, 2019.

Notice of Allowance on U.S. Appl. No. 16/051,176 dated May 22, 2019.

Notice of Allowance on U.S. Appl. No. 16/051,991 dated May 20, 2019.

Notice of Allowance on U.S. Appl. No. 16/051,991 dated Jun. 18, 2019.

Notice of Allowance on U.S. Appl. No. 16/234,238 dated Feb. 20, 2019.

Notice of Allowance on U.S. Appl. No. 16/110,475 dated Nov. 22, 2019 (8 pages).

Notice of Allowance on U.S. Appl. No. 16/051,190 dated Nov. 26, 2019 (2 pages).

Notice of Allowance on U.S. Appl. No. 16/232,981 dated Dec. 17, 2019 (10 pages).

Notice of Allowance on U.S. Appl. No. 16/051,190 dated Nov. 7, 2019 (10 pages).

Notice of Allowance on U.S. Appl. No. 16/233,842 dated Nov. 20, 2019 (8 pages).

Final Office Action on U.S. Appl. No. 16/110,475 dated Sep. 17, 2019 (17 pages).

International Search Report and Written Opinion for PCT/CN2019/079353 dated Jul. 1, 2019 (11 pages).

International Search Report and Written Opinion on PCT Appln. Ser. No. PCT/CN2018/125644 dated Apr. 2, 2019 (9 pages).

International Search Report and Written Opinion on PCT Appln. Ser. No. PCT/CN2019/079352 dated Jun. 28, 2019 (11 pages).

International Search Report and Written Opinion on PCT/CN2019/079350 dated Jul. 3, 2019 (11 pages).

Notice of Allowance on U.S. Appl. No. 16/051,176 dated Jul. 31, 2019 (2 pages).

Notice of Allowance on U.S. Appl. No. 16/051,176 dated Sep. 18, 2019 (9 pages).

Notice of Allowance on U.S. Appl. No. 16/051,190 dated Jul. 1, 2019 (10 pages).

Notice of Allowance on U.S. Appl. No. 16/051,193 dated Jul. 3, 2019 (11 pages).

Notice of Allowance on U.S. Appl. No. 16/051,991 dated Sep. 18, 2019 (9 pages).

Notice of Allowance on U.S. Appl. No. 16/110,513 dated Oct. 17, 2019 (2 pages).

Notice of Allowance on U.S. Appl. No. 16/110,513 dated Sep. 4, 2019 (9 pages).

Notice of Allowance on U.S. Appl. No. 16/232,981 dated Aug. 13, 2019 (9 pages).

Notice of Allowance on U.S. Appl. No. 16/233,028 dated Jul. 3, 2019 (11 pages).

Notice of Allowance on U.S. Appl. No. 16/233,826 dated Jul. 31, 2019 (8 pages).

Notice of Allowance on U.S. Appl. No. 16/233,842 dated Sep. 18, 2019 (11 pages).

Notice of Allowance on U.S. Appl. No. 16/234,242 dated Oct. 24, 2019 (11 pages).

Non-Final Office Action on U.S. Appl. No. 16/131,459 dated Apr. 16, 2020 (16 pages).

Notice of Allowance on U.S. Appl. No. 16/232,981 dated Apr. 24, 2020 (10 pages).

Final Office Action on U.S. Appl. No. 16/110,559 dated Dec. 26, 2019 (18 pages).

Notice of Allowance on U.S. Appl. No. 16/051,176 dated Jan. 22, 2020 (10 pages).

Notice of Allowance on U.S. Appl. No. 16/051,193 dated Jan. 10, 2020 (9 pages).

Notice of Allowance on U.S. Appl. No. 16/051,991 dated Jan. 22, 2020 (10 pages).

Notice of Allowance on U.S. Appl. No. 16/110,513 dated Jan. 2, 2020 (9 pages).

Notice of Allowance on U.S. Appl. No. 16/110,559 dated Mar. 30, 2020 (9 pages).

Notice of Allowance on U.S. Appl. No. 16/233,028 dated Jan. 16, 2020 (9 pages).

Notice of Allowance on U.S. Appl. No. 16/233,626 dated Jan. 30, 2020 (9 pages).

Notice of Allowance on U.S. Appl. No. 16/233,842 dated Dec. 20, 2019 (4 pages).

Notice of Allowance on U.S. Appl. No. 16/234,242 dated Mar. 16, 2020 (9 pages).

\* cited by examiner

INVERTER MODULE OF AN ELECTRIC VEHICLE

CROSS REFERENCE TO RELATED APPLICATION

The present application claims the benefit of priority under 35 U.S.C. § 119(e) to U.S. Provisional Application 62/659,092, filed on Apr. 17, 2018, tilted "INVERTER MODULE OF AN ELECTRIC VEHICLE," which is incorporated herein by reference in its entirety.

BACKGROUND

Batteries can include electrochemical materials to supply electrical power to various electrical components connected thereto. Such batteries can provide electrical energy to various electrical systems.

SUMMARY

Systems and methods described herein relate to a multiple phase inverter module formed having three power modules (which can also be referred to as half-bridge modules, half-bridge inverter modules or sub-modules) arranged, for example, in a triplet configuration for electric vehicle drive systems. The inverter module can be coupled with a drive train unit of an electric vehicle and can provide three phase voltages to the drive train unit. For example, each of the power modules can generate a single phase voltage and thus, the three half-bridge modules arranged in a triplet configuration can provide three phase voltages.

At least one aspect is directed to an inverter module to power an electric vehicle. The inverter module can include a power module. The power module can include a capacitor. The power module can include a heat sink coupled with a first surface of the capacitor. The power module can include a first ceramic plate coupled with a first surface of the heat sink. The power module can include a second ceramic plate coupled with the first surface of the heat sink. The power module can include a locator having a plurality of slots. The power module can include a plurality of transistors disposed within the plurality of slots. The locator and the plurality of transistors can be disposed over a first surface of the first ceramic plate and a first surface of the second ceramic plate. The power module can include a laminated bus bar disposed over a first surface of the locator. The power module can include a gate drive printed circuit board coupled with a first surface of the laminated bus bar. The power module can include a dielectric gel tray disposed over a first surface of the gate drive printed circuit board.

At least one aspect is directed to a method to provide electrical power via an inverter module to power an electric vehicle. The method can include providing a capacitor. The method can include coupling a heat sink with a first surface of the capacitor. The method can include disposing a first ceramic plate with a first surface of the heat sink. The method can include disposing a second ceramic plate with the first surface of the heat sink. The method can include providing a locator having a plurality of slots. The method can include disposing a plurality of transistors within the plurality of slots. The locator and the plurality of transistors can be disposed over a first surface of the first ceramic plate and a first surface of the second ceramic plate. The method can include providing a laminated bus bar over a first surface of the locator. The method can include coupling a gate drive printed circuit board with a first surface of the laminated bus bar. The method can include disposing a dielectric gel tray over a first surface of the gate drive printed circuit board.

At least one aspect is directed to a method. The method can provide an inverter module to power an electric vehicle. The inverter module can include a power module. The power module can include a capacitor. The power module can include a heat sink coupled with a first surface of the capacitor. The power module can include a first ceramic plate coupled with a first surface of the heat sink. The power module can include a second ceramic plate coupled with the first surface of the heat sink. The power module can include a locator having a plurality of slots. The power module can include a plurality of transistors disposed within the plurality of slots. The locator and the plurality of transistors can be disposed over a first surface of the first ceramic plate and a first surface of the second ceramic plate. The power module can include a laminated bus bar disposed over a first surface of the locator. The power module can include a gate drive printed circuit board coupled with a first surface of the laminated bus bar. The power module can include a dielectric gel tray disposed over a first surface of the gate drive printed circuit board.

At least one aspect is directed to an electric vehicle. The electric vehicle can include an inverter module to power the electric vehicle. The inverter module can include a power module. The power module can include a capacitor. The power module can include a heat sink coupled with a first surface of the capacitor. The power module can include a first ceramic plate coupled with a first surface of the heat sink. The power module can include a second ceramic plate coupled with the first surface of the heat sink. The power module can include a locator having a plurality of slots. The power module can include a plurality of transistors disposed within the plurality of slots. The locator and the plurality of transistors can be disposed over a first surface of the first ceramic plate and a first surface of the second ceramic plate. The power module can include a laminated bus bar disposed over a first surface of the locator. The power module can include a gate drive printed circuit board coupled with a first surface of the laminated bus bar. The power module can include a dielectric gel tray disposed over a first surface of the gate drive printed circuit board.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component can be labeled in every drawing. In the drawings.

DETAILED DESCRIPTION

Following below are more detailed descriptions of various concepts related to, and implementations of battery cells for battery packs in electric vehicles. The various concepts introduced above and discussed in greater detail below can be implemented in any of numerous ways.

Systems and methods described herein relate to an inverter module that can be formed from one or more power modules to power an electric vehicle. Each of the power modules can generate or provide a single phase power. Multiple power modules can couple together to form a multiple phase inverter module. For example, three power modules 100 can couple together in a triplet configuration to form a three phase power module that provides three phase power to electrical components within an electrical vehicle.

Figure 1:
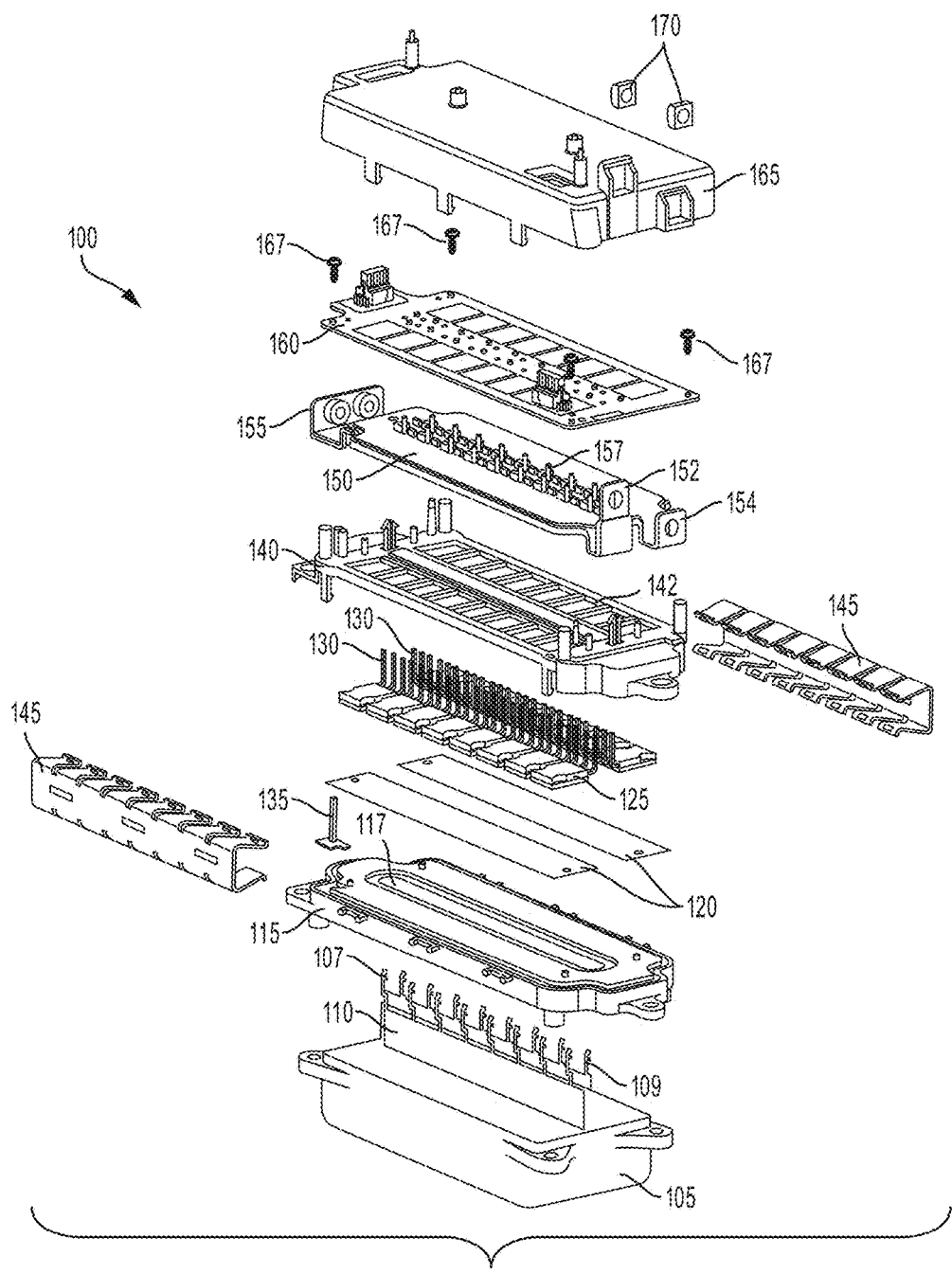
FIG. 1 is an example exploded view of a single phase power module of a multiple phase inverter module of a drive unit of an electric vehicle; according to an illustrative implementation.

FIG. 1, among others, depicts a cross-sectional view of a power module 100. The power module 100 can be one power module of a multiple phase inverter module (e.g., inverter module 400 of FIG. 4) disposed within a drive train unit of an electric vehicle to power the respective electric vehicle. For example, the power module 100 can couple with two other power modules 100 in a triplet configuration to form a three-phase inverter module (e.g., inverter module 400 of FIG. 4). Each of the power modules 100 can be formed having the same components and dimensions to provide inverter functionality based at least in part on the modular design (e.g., ease of assembly) and ability to be adapted for a variety of different inverter applications.

The power modules 100 described herein can be formed and arranged within an inverter module (e.g., inverter module 400 of FIG. 4) in a triplet configuration to provide a compact design. For example, a power module 100 can be formed having a length in a range from 220 mm to 230 mm. The power module 100 can be formed having a width in a range from 80 mm to 90 mm. The power module 100 can be formed having a height in a range from 60 mm to 70 mm. The dimensions and size of the power modules 100 described herein can vary outside these ranges. As depicted in FIG. 1, the power module 100 includes at least one capacitor 105 having a first surface (e.g., top surface) and a second surface (e.g., bottom surface). The capacitor 105 can include DC-Link, Single-Phase Capacitors ("DCLSP Capacitors") used as X capacitors, DC-Link filtering capacitors or automotive, industrial, or commercial inverters. The capacitor 105 can include a housing or outer surface that can be formed from a variety of different materials, including but not limited to, plastic material or non-conductive material. The dimensions of the capacitor 105 can vary and can be selected based at least in part on the dimensions of the power module 100. For example, the capacitor 105 can have a length in a range from 140 mm to 155 mm (e.g., 150 mm). The capacitor 105 can have a width in a range from 60 mm to 70 mm (e.g., 66 mm). The capacitor 105 can have a height in a range from 30 mm to 40 mm (e.g., 32 mm).

The capacitor 105 can include terminals 107, 109 and a divider 110. The terminals 107, 109 can include positive terminals 107 and negative terminals 109. For example, positive terminals 107 can extend from or be coupled with a first side surface of the divider 110 and negative terminals 109 can extend from or be coupled with a second side surface of the divider 110. Thus, the divider 110 can be disposed or otherwise positioned to separate the positive terminals 107 from the negative terminals 109 of the capacitor 105. The capacitor 105 can include one or more capacitor elements disposed within the capacitor 105. For example, the capacitor 105 can house a single capacitor film roll or multiple capacitor film rolls (e.g., three to four capacitor film rolls). The capacitor film rolls can be coupled with the positive terminals 107 and the negative terminals 109 through one or more tabs. The capacitor film rolls and thus the capacitor 105 can have a capacitance value of 200-400 nanofarads (nF), e.g., 300 nF. The capacitance value can vary within or outside this range.

The positive terminals 107 can correspond to leads or terminals of a positive bus bar of the capacitor 105. The negative terminals 109 can correspond to leads or terminals of a negative bus bar of the capacitor 105. For example, the capacitor 105 can include a positive bus bar and a negative bus bar, for example, disposed within the housing of the capacitor 105. The positive terminals 107 can include leads, terminals or extensions of the positive bus bar that extend out of the capacitor 105 to couple with leads of other components of the power module 100, such as but not limited to, transistors (e.g., leads 130 of transistors 125) of the power module 100. The negative terminals 109 can include leads, terminals or extensions of the negative bus bar that extend out of the capacitor 105 to couple with leads of other components of the power module 100, such as but not limited to, transistors (e.g., leads 130 of transistors 125) of the power module 100.

The divider 110 can be disposed between the positive terminals 107 and the negative terminals 109 to electrically isolate or electrically insulate the positive terminals 107 and the negative terminals 109. The shape and dimensions of the divider 110 can vary and can be selected based at least in part on the shape and dimensions of the positive terminals 107 and the negative terminals 109. For example, a thickness or width of the divider 110 can be in a range from 0.5 mm to 1.5 mm. A length of the divider 110 can be in a range from 130 mm to 145 mm (e.g., 140 mm). A height of the divider 110 can be in a range from 20 mm to 30 mm (e.g., 25 mm). The thickness, width, length or height of the divider 110 can vary within or outside these ranges.

The power module 100 can include at least one heat sink 115 having a first surface (e.g., top surface) and a second surface (e.g., bottom surface). The second surface of the heat sink 115 can be coupled with, disposed over or otherwise in contact with the first surface of the capacitor 105. The heat sink 115 can include a variety of different materials, such as but not limited to, conductive material, metal material, metallic material or aluminum. The heat sink 115 can provide active cooling to the capacitor 105. For example, the heat sink 115 can be disposed proximate to at least one surface, here the first surface (e.g., top surface) of the capacitor 105 and the heat sink 115 can provide active cooling to the first surface of the capacitor 105. For example, the heat sink 115 can have a shape that defines one or more cooling channels formed within the heat sink 115. The cooling channels can receive and be shaped to allow coolant to flow through the heat sink 115 such that the heat sink 115 can provide active cooling to components and electronics (e.g., capacitor 105, transistors 125) disposed proximate to surfaces of the heat sink 115.

The heat sink 115 can have a length in a range from 200 mm to 225 mm (e.g., 215 mm). The heat sink 115 can have a height (e.g., thickness) in a range from 5 mm to 20 mm (e.g., 10 mm). The heat sink 115 can have a width in a range from 45 mm to 65 mm (e.g., 52 mm). The length, height, and width of the heat sink 115 can vary within and outside these ranges. The heat sink 115 can be disposed within the power module 100 such that the heat sink 115 surrounds, is disposed about, or disposed around a portion of terminals 107, 109 of the capacitor 105 that couple with transistors (e.g., transistors 125) of the power module 100. For example, the heat sink 115 can include an aperture 117 (e.g., hole, orifice) formed in a middle portion of the heat sink 115. The capacitor 105 can couple with the heat sink 115 such that the divider 110, positive terminals 107, and negative terminals 109 extend through the aperture 117 of the heat sink 115. Thus, the heat sink 115 can be positioned such that it surrounds surfaces of the divider 110, positive terminals 107, and negative terminals 109 to provide active cooling to the divider 110, positive terminals 107, negative terminals 109, and transistors 125. The heat sink 115 can be positioned such that cool surfaces and coolant flowing through the heat sink 115 are disposed closer to these electrical components. Thus, the heat sink 115 can provide active cooling to each of the capacitor 105, the positive terminals 107, the negative terminals 109, and transistors of the power module 100 to reduce inductance value in the power module 100 and reduce EMI noise in the inverter module. The heat sink aperture 117 can have a width in a range from 10 mm to 20 mm (e.g., 12 mm). The heat sink aperture 117 can have a length in a range from 140 mm to 120 mm (e.g., 150 mm). The heat sink aperture 117 can have a height (or depth) in a range from 3 mm to 15 mm (e.g., 4 mm, 8 mm). The width, length, or height of the heat sink aperture 117 can vary within or outside these ranges.

The power module 100 can include one or more ceramic plates 120 coupled to, disposed over or otherwise in contact with the first surface of the heat sink 115. For example, and as depicted in FIG. 1, the power module 100 can include first and second ceramic plates 120. Each of the first and second ceramic plates 120 can include a first surface (e.g., top surface) and a second surface (e.g., bottom surface). Each of the second surfaces of the first and second ceramic plates 120 can couple with, be disposed over or otherwise in contact with the first surface of the heat sink 115. The ceramic plates 120 can insulate the heat sink 115 from one or transistors (e.g., transistors 125) disposed within the power module 100. The ceramic plates 120 may include ceramic based material and can electrically insulate the heat sink 115 from transistors (e.g., transistors 125) disposed within the power module 100. For example, the ceramic plates 120 can prevent a short circuit condition between the heat sink 115 and the transistors (e.g., transistors 125) disposed within the power module 100. The ceramic plates 120 can have a length in a range from 100 mm to 250 mm. The ceramic plates 120 can have a width in a range from 40 mm to 55 mm. The ceramic plates 120 have a height (or thickness) in a range from 2 mm to 10 mm.

The power module 100 can include a plurality of transistors 125. The plurality of transistors 125 can couple with or be disposed over or otherwise in contact with the first surface of the ceramic plates 120. Each of the transistors 125 can include a plurality of leads 130. The transistors 125 can include discrete insulated-gate bipolar transistors (IGBT's), IGBT semiconductor dies, TO-247 transistors, or TO-247 discreet IGBT packages (e.g., TO-247 transistors, switches). Each of the transistors 125 can include one or more leads 130. For example, each of the transistors 125 may include three leads 130. Each of the three leads 130 can corresponds to at least one of the terminals of the transistor 125. For example, a first lead 130 can correspond to the base terminal or base lead. A second lead 130 can correspond to the collector terminal or collector lead. A third lead 130 can correspond to the emitter terminal or emitter lead. The leads 130 can have a generally straight or unbent shape. When the transistors 125 are fully coupled within the power module 100, the leads 130 can be bent, shaped or otherwise manipulated to couple with a respective one or more components (e.g., gate drive PCB 160, capacitor 105) within the power module 100. For example, the leads 130 can be formed such that they extend perpendicular with respect to a first surface (e.g., top surface) of the transistors 125. For example, the leads 130 can be formed such that they have a bent shape and extend up with respect to a first surface (e.g., top surface) of the transistors 125.

The plurality of transistors 125 can be organized in a predetermined arrangement. For example, the plurality of transistors 125 can be disposed in one or more rows having multiple transistors 125 and the rows can be disposed such that the leads 130 of each of the transistors 125 are proximate to or adjacent to each other to allow for ease of coupling with components (e.g., gate drive PCB 160) of the power module 100. For example, a first plurality of transistors 125 can be arranged in a first row and a second plurality of transistors 125 can be arranged in a second row. Each of the rows of transistors 125 may include the same number of transistors or the rows of transistors 125 may include a different number of transistors 125. The transistors 125 in the same row can be positioned such that one or more side edges are in contact with a side edge of a single transistor 125 or two transistors 125 of the same row (e.g., one transistor 125 on each side). Thus, the transistors 125 can be arranged in a uniformed row along the first surface of the ceramic plates 120. The first plurality of transistors 125 can be spaced from the second plurality of transistors 125. The first plurality of transistors 125 can be evenly spaced or symmetrically from the second plurality of transistors 125 with respect to the first surface of the ceramic plates 120. For example, each of the transistors 125 in the first plurality of transistors 125 can be spaced the same distance from a corresponding transistor 125 of the second plurality of transistors 125. The first plurality of transistors 125 can be asymmetrically spaced from the second plurality of transistors 125 with respect to the first surface of the ceramic plates 120. For example, one or more of the transistors 125 in the first plurality of transistors 125 can be spaced different distances from corresponding transistors 125 of the second plurality of transistors 125. The one or more of the transistors 125 in the first plurality of transistors 125 can be spaced with respect to each other with a pitch (e.g., center to center spacing) in a range from 15 mm to 20 mm (e.g., 17.5 mm). The one or more of the transistors 125 in the second plurality of transistors 125 can be spaced with respect to each other with a pitch (e.g., center to center spacing) in a range from 15 mm to 20 mm (e.g., 17.5 mm). The one or more of the transistors 125 in the first plurality of transistors 125 can be spaced with respect to the one or more transistors 125 in the second plurality of transistors 125 in a range from 10 mm to 20 mm (e.g., 14 mm).

The power module 100 can include at least one temperature sensor 135 such as a transistor temperature sensing printed circuit board (PCB) 135. The transistor temperature sensing PCB 135 (or other temperature sensor) can include control electronics to communicate or monitor temperatures of different components of the power module 100, such as but not limited to transistors 125. For example, the transistor temperature sensing PCB 135 can be disposed proximate to the plurality of transistors 125 to provide temperature data corresponding to the plurality of transistors 125. For example, the transistor temperature sensing PCB 135 can be disposed between the ceramic plates 120 and the plurality of transistors 125 or between the heat sink 115 and the ceramic plates 120. The transistor temperature sensing PCB 135 can collect or retrieve temperature data corresponding to the plurality of transistors 125. The transistor temperature sensing PCB 135 can collect or retrieve temperature data corresponding to individual transistors 125, groups of transistors 125 or all of the plurality of transistors 125 collectively. For example, the temperature sensing can be extrapolated to predict IGBT junction temperatures. The transistor temperature sensing PCB 135 may be positioned such that it is compressed and sealed against a pocket of grease on the ceramic, adjacent to the transistors 125. For example, the transistor temperature sensing PCB 135 can be disposed a distance from the transistors 125 that ranges from 0 mm (e.g., in contact) to 2 mm. The distance between the transistor temperature sensing PCB 135 can vary outside these ranges.

The power module 100 can include a locator 140 (which can also be referred to herein as a locator guide or locator frame). The locator 140 can include a first surface (e.g., top surface) and a second surface (e.g., bottom surface). The second surface of the locator 140 can couple with, be disposed over or in contact with the first surface of the ceramic plates 120 or the heat sink 115. The locator 140 can include non-conductive material or plastic material. The locator 140 can have a length in a range from 200 mm to 225 mm (e.g., 215 mm). The locator 140 can have a height (e.g., thickness) in a range from 5 mm to 20 mm (e.g., 10 mm). The locator 140 can have a width in a range from 45 mm to 65 mm (e.g., 52 mm). The length, height, and width of the locator 140 can vary within and outside these ranges. The locator 140 can includes a plurality of slots 142 (e.g., apertures, holes, recesses) formed in a frame of the locator 140 to hold or couple various components of the power module 100 in place. The locator 140 can include the plurality of slots 142 to hold or couple with the transistors 125. At least on transistor 125 of the plurality of transistors 125 can be disposed or coupled with at least one slot 142 of the locator 140.

A plurality of clips 145 can couple the transistors 125 with the locator 140 (e.g., hold the transistors 125 in the slots 142 of the locator 140). For example, each of the plurality of transistors 125 can be disposed within at least one slot 142 of the locator 140 and the clips 145 can include spring clips that couple onto a side portion of the locator 140 and the transistors 125 to hold or compress the transistors 125 within a respective slot 142 to hold the transistors 125 in place and in contact with the locator 140. Fasteners 167 may be used to couple the transistors 125 with the locator 140. The locator 140 can include a plastic locator or plastic material.

The slots 142 of the locator 140 can include apertures, holes, recesses formed in a frame of the locator 140. The slots 142 can have varying shapes, sizes and dimensions and the shapes, sizes and dimensions of a particular slot 142 can be selected based at least in part on the shape, size or dimension of a component of the power module 100. For example, the locator 140 may include slots 142 for transistors 125, fasteners, clips, thermistors or thermal pads. The transistors slots have a generally rectangular shape which can be selected based on the particular transistor 125 to be used in the power module 100. The fastener slots can have a generally round shape and may include a threaded inner surface to couple with a threaded portion of a fastener. The thermistor slots can have a generally round shape. The power module 100 may include only one thermistor, thus only one thermistor slot may be used. However, two thermistor slots can be formed to provided symmetry and ease of manufacture. For example, having two thermistor slots can allow for the locator 140 to be rotated and a thermistor of the power module 100 can be disposed within either thermistor slot. The locator 140 can be formed having any number of slots 142, and the number of slots 142 can be selected based at least on the type of components of the power module 100. For example, the total number of slots 142 formed in the locator 140 can range from eight slots 142 to twenty four slots 142.

The locator 140 can operate as a guide or frame for a manufacture process of the power module 100, such as during a pick and place automation process, to increase an efficiency of the manufacture process. For example, the locator 140 can keep different components or parts of the power module 100 from moving around during manufacture resulting in a reducing an amount of fixturing (e.g., identifying and moving parts to correct locations) during the manufacture process. The power module 100 can be formed faster and more efficiently using the locator 140 as a guide for an automation device (e.g., pick and place automation machinery). The locator 140 can reduce the amount of human interaction with a particular manufacture process and therefore, the power module 100 can be formed using just the pick and place machinery and a grease dispenser device (or other form of fluid device).

The power module 100 can include a laminated bus bar 150. The laminated bus bar 150 can include a first surface (e.g., top surface) and a second surface (e.g., bottom surface). The second surface of the laminated bus bar 150 can couple with, be disposed over or in contact with the first surface of the locator 140 and portions of the first surface of the transistors 125 disposed in the slots 142 of the locator 140. The leads 130 of the transistors 125 can couple with portions of the laminated bus bar 150. For example, the laminated bus bar 150 can include a plurality of leads 157. Each of the plurality of leads 157 of the laminated bus bar 150 can couple with at least one lead 130 of the plurality of transistors 125. For example, at least two leads 157 of the laminated bus bar 150 can couple with at least two leads of a transistor 125 of the plurality of transistors 125. but three are two leads that are coupled between laminated bus bar and each transistor. The laminated bus bar 150 can have a length in a range from 200 mm to 225 mm. The laminated bus bar 150 can have a height (e.g., thickness) in a range from 5 mm to 20 mm. The laminated bus bar 150 can have a width in a range from 45 mm to 65 mm. The length, height, and width of the laminated bus bar 150 can vary within and outside these ranges. The laminated bus bar 150 can include or conductive material, such as but not limited to copper.

The laminated bus bar 150 can include includes two input terminals 152, 154 (e.g., positive input terminal and negative input terminal) disposed at or along a first side and an output terminal 155 disposed at a second, different side of the laminated bus bar 150. For example, the two input terminals 152, 154 can be disposed at an opposite or opposing side as compared to the output terminal 155. The first and second input terminals 152, 154 can include conductive material, such as but not limited to copper. The first and second input terminals 152, 154 can be formed in a variety of different shapes to accommodate coupling with an inverter bus bar (e.g., positive bus bar, negative bus bar). The first and second input terminals 152, 154 can have or include a straight shape, or a curved or bent shape. For example, the first and second input terminals 152, 154 can include a first portion that is parallel with respect to a first surface (e.g., top surface) of the laminated bus bar 150 and a second portion that is perpendicular with respect to the first surface of the laminated bus bar 150. The first input terminal 152 can couple with a positive inverter bus-bar (not shown) to receive a positive voltage and provide the positive voltage to the power module 100. The second input terminal 154 can couple with a negative bus-bar (not shown) to receive a negative voltage and provide the negative voltage to the power module 100. The first input terminal 152 can be disposed at a different level or height with respect to the side surface of the laminated bus bar 150 as compared with the second input terminal 154. For example, the first input terminal 152 can be disposed at first level or first height and the second input terminal 154 can be disposed at a second level or second height. The first level or first height can be greater than the second level or the second height. The first level or first height can be less than the second level or the second height.

The output terminal 155 can include conductive material, such as but not limited to copper. The output terminal 155 can be formed in a variety of different shapes to accommodate coupling with an inverter phase bus bar. The output terminal 155 can be formed having a straight shape, or a curved or bent shape. For example, the output terminal 155 can include a first portion that is parallel with respect to a first surface (e.g., top surface) of the laminated bus bar 150 and a second portion that is perpendicular with respect to the first surface of the laminated bus bar 150. The output terminal 155 can couple with a phase bus-bar to provide power generated by the power module 100 to other electrical components of an electric vehicle.

The power module 100 can include a gate drive printed circuit board (PCB) 160. The gate drive PCB 160 can include a first surface (e.g., top surface) and a second surface (e.g., bottom surface). The second surface of gate drive PCB 160 can couple with or be disposed over or in contact with the first surface of the laminated bus bar 150. The gate drive PCB 160 can include control electronics to control one or more components of the power module 100 or communication electronics to communicate with and receive from or transmit signals to a control board of an inverter module. The gate drive PCB 160 can include control electronics and can generate and provide control signals to the transistors 125. For example, the leads 130 of the transistors 125 can extend through the locator 140 and the laminated bus bar 150 to couple with a portion or surface of the gate drive PCB 160. The gate drive PCB 160 can generate control signals, for example, to turn one or more of transistors 125 on or off, open or close. The gate drive PCB 160 can have a length in a range from 140 mm to 220 mm. The gate drive PCB 160 can have a height (e.g., thickness) in a range from 5 mm to 10 mm. The gate drive PCB 160 can have a width in a range from 60 mm to 100 mm. The length, height, and width of the gate drive PCB 160 can vary within and outside these ranges.

The power module 100 can include a dielectric gel tray 165. The dielectric gel tray 165 can include a first surface (e.g., top surface), a second surface (e.g., bottom surface) and can define an inner region that includes the second surface. The second surface of the dielectric gel tray 165 can couple with or be disposed over or contact the gate drive PCB 160. The dielectric gel tray 165 can couple with the capacitor 105 though one or more fasteners 167. For example, the dielectric gel tray 165 can form a housing that is disposed over the gate drive PCB 160, laminated bus bar 150, locator 140, transistors 125, transistor temperature sensing PCB 135, the ceramic plates 120, the heat sink 115 such that that each of the gate drive PCB 160, laminated bus bar 150, locator 140, transistors 125, transistor temperature sensing PCB 135, the ceramic plates 120, and the heat sink 115 are disposed within the inner region defined by the dielectric gel tray 165 and thus covered by the dielectric gel tray 165 when the dielectric gel tray 165 is coupled with the capacitor 105. For example, the dielectric gel tray 165 can include or be formed having an inner region that covers, submerges, or can be disposed about multiple components of the power module 100.

The dielectric gel tray 165 (e.g., potting compound container) can include poly carbon material, or other forms of high temperature plastic. The dielectric gel tray 165 can be formed using various injection molded techniques. The dielectric gel tray 165 can be disposed over one or more components of the power module 100 and operate as an insulator for the components (e.g., electronics) of the power module 100. The gel tray 165 can be formed having a length in a range from 160 mm to 240 mm. The gel tray 165 can be formed having a width in a range from 80 mm to 90 mm. The gel tray 165 can be formed having a height in a range from 40 mm to 60 mm. The dimensions and size of the gel tray 165 can vary within or outside these ranges.

The gel tray 165 includes one or more capacitive orifices 170. The capacitive orifices 170 can be used as inputs or outputs for the power module 100. For example, the capacitive orifices 170 can be formed as a hole or an access point to couple a power supply (e.g., DC power supply) to the power module 100. The gel tray 165 can include a first capacitive orifice 170 that couples the first input terminal 152 of the laminated bus bar 150 with a positive bus bar to provide a positive power supply to the power module 100. The gel tray 165 can include a second capacitive orifice 170 that couples the second input terminal 154 of the laminated bus bar 150 with a negative bus bar to provide a negative power supply to the power module 100. The gel tray 165 can include a third capacitive orifice 170 that couples the output terminal 155 of the laminated bus bar 150 with a phase bus bar to provide an output voltage generated by the power module 100 to other components of an electric vehicle. For example, capacitive orifices 170 can be formed as a hole or an access point to provide a power (e.g., voltage) generated by the power module 100 to other systems, such as a drive train unit of an electric vehicle.

During development and manufacturing of a power module 100, technological or physical compromises with respect to the different components of the power module 100 can be made to meet one or more needs or requirements of a particular electrical drive system. For example, compromises can be made between cost, engineering flexibility, manufacturing, packaging design, thermal design or electrical design of one or more components of the respective power module 100. These compromises may result in undesirable design changes that can impact a performance of the power module 100. The power modules 100 described herein can alleviate the issues associated with these compromises and provide a power module 100 including IGBT transistors 125, the IGBT temperature sensing PCB 135, a coolant temperature sensor (e.g., coolant temperature sensor 310 of FIG. 3), thermal pads (e.g., thermal pads 320 of FIG. 3) and an EMI shield (e.g., EMI shield 410 of FIG. 4) to reduce or lessen EMI noise within an inverter module (e.g., inverter module 400 of FIG. 4). Thus, the power modules 100 described herein can strike a balance between high performance (e.g., low electrical parasitics, high current capacity, low component temperatures, etc.), high power density, low volume, low cost and having properties that allow them to be compatible for mass production.

Figure 2:
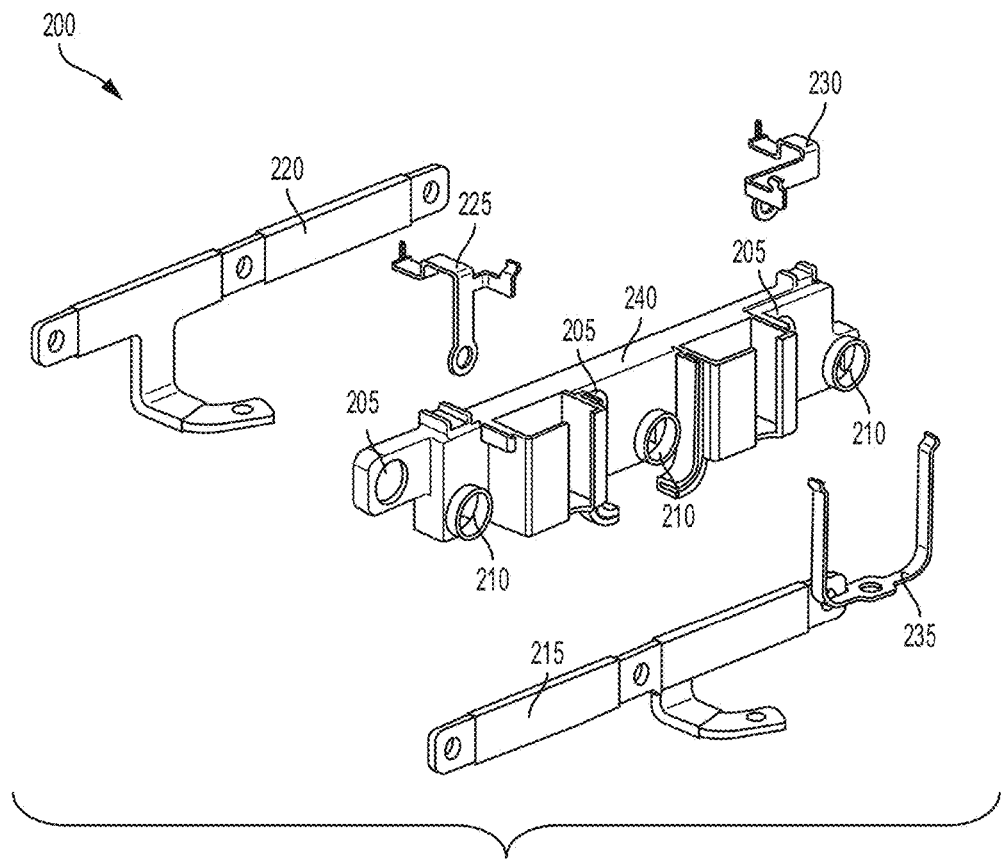
FIG. 2 depicts an example exploded view of a subassembly having positive and negative link bus bars of a multiple phase inverter module of a drive unit of an electric vehicle, according to an illustrative implementation.

FIG. 2, among others, depicts a subassembly 200. The subassembly 200 can transfer power (e.g., direct current, direct voltage) from a battery box or junction box to each phase of a power module (e.g., power module 100 of FIG. 1). The subassembly can filter the power using the positive and negative bus bars and provide high voltage sensing to a control board (e.g., control board 415 of FIG. 4) of an inverter module (inverter module 400 of FIG. 4) or a control board (e.g., gate drive PCB 160 of FIG. 1) of a power module 100 within the inverter module (inverter module 400 of FIG. 4). For example, the subassembly 200 can couple with the power module 100 to transfer power to the power module 100 through one or more conducting paths formed by the positive and negative bus bars of the subassembly 200. The subassembly 200 can couple with a single power module 100 or multiple power modules 100. The subassembly 200 can include one or more positive input orifices 205 to couple with positive inputs 152 of each power module 100 and one or more negative input orifices 210 to couple with negative inputs 154 of each power module 100. For example, and as depicted in FIG. 2, the subassembly 200 can include three positive input orifices 205 and three negative input orifices 210. Thus, the subassembly 200 can transfer power to three power modules 100 coupled in a triplet configuration to form a three phase power module (e.g., three phase power module 405 of FIG. 4).

The subassembly 200 can include a positive DC link bus bar 215. The positive DC link bus bar 215 can couple with a positive input or positive input terminal (e.g., positive input 152) of the power module 100. The positive DC link bus bar 215 can provide or transfer a positive direct current from a battery box or junction box to the positive input of the respective power module 100. The positive DC link bus bar 215 can include conductive material, metal material or metallic material (e.g., copper). The positive DC link bus bar 215 can include can operate as or serve as conducting paths within the subassembly 200.

The subassembly 200 can include a negative DC link bus bar 220. The negative DC link bus bar 220 can couple with a negative input or negative input terminal (e.g., negative input terminal 154) of a power module 100. The negative DC link bus bar 220 can provide or transfer a negative direct current from a battery box or junction box to the negative input of the respective power module 100. The negative DC link bus bar 220 can include conductive material, metal material or metallic material (e.g., copper). The negative DC link bus bar 220 can include can operate as or serve as conducting paths within the subassembly 200.

The subassembly 200 can include a positive Y-capacitor bus bar 225. The positive Y-capacitor bus bar 225 can couple the positive input terminal 152 of the power module 100 with the positive DC link bus bar 215. The positive Y-capacitor bus bar 225 can filter direct current as the direct current is provided to the input terminal of the power module 100. The positive Y-capacitor bus bar 225 may include line filter capacitors. For example, the positive Y-capacitor bus bar 225 can filter positive direct current provided to a positive input terminal (e.g., positive input terminal 152) of the power module 100 to reduce or lessen noise, such as but not limited to, common mode noise. The positive Y-capacitor bus bar 225 can include conductive material, metal material or metallic material (e.g., copper). The positive Y-capacitor bus bar 225 can include can operate as or serve as conducting paths within the subassembly 200.

The subassembly 200 can include a negative Y-capacitor bus bar 230. The negative Y-capacitor bus bar 230 can couple the negative input terminal 154 of the power module 100 with the negative DC link bus bar 220. The negative Y-capacitor bus bar 230 can filter direct current as the direct current is provided to the input terminal of the power module 100. The negative Y-capacitor bus bar 230 may include line filter capacitors. For example, the negative Y-capacitor bus bar 230 can filter negative direct current provided to a negative input terminal of the power module 100 to reduce or lessen noise, such as but not limited to, common mode noise. The negative Y-capacitor bus bar 230 can include conductive material, metal material or metallic material (e.g., copper). The negative Y-capacitor bus bar 230 can include can operate as or serve as conducting paths within the subassembly 200.

The subassembly 200 can include a ground Y-capacitor bus bar 235. The ground Y-capacitor bus bar 235 can filter direct current as the direct current is provided to an input terminal of the power module 100. The ground Y-capacitor bus bar 235 may include line filter capacitors. The ground Y-capacitor bus bar 235 can filter direct current on a ground terminal of the power module 100 to reduce or lessen noise, such as but not limited to, common mode noise. The ground Y-capacitor bus bar 235 can include conductive material, metal material or metallic material (e.g., copper). The ground Y-capacitor bus bar 235 can include can operate as or serve as conducting paths within the subassembly 200.

The subassembly 200 can include a holder 240. The holder 240 can include a plastic holder, plastic material, or dielectric material. The holder 240 can hold or align each of the positive DC link bus bar 215, the negative DC link bus bar 220, the positive Y-capacitor bus bar 225, the negative Y-capacitor DC link bus bar 210 and the ground Y-capacitor 235 such that they can couple with the appropriate components of a power module 100. For example, each of the positive DC link bus bar 215, the negative DC link bus bar 220, the positive Y-capacitor bus bar 225, the negative Y-capacitor DC link bus bar 210 and the ground Y-capacitor 235 can couple with the power module 100 though the holder 240. The holder 240 can couple with at least one side surface or edge surface of the power module 100.

Figure 3:
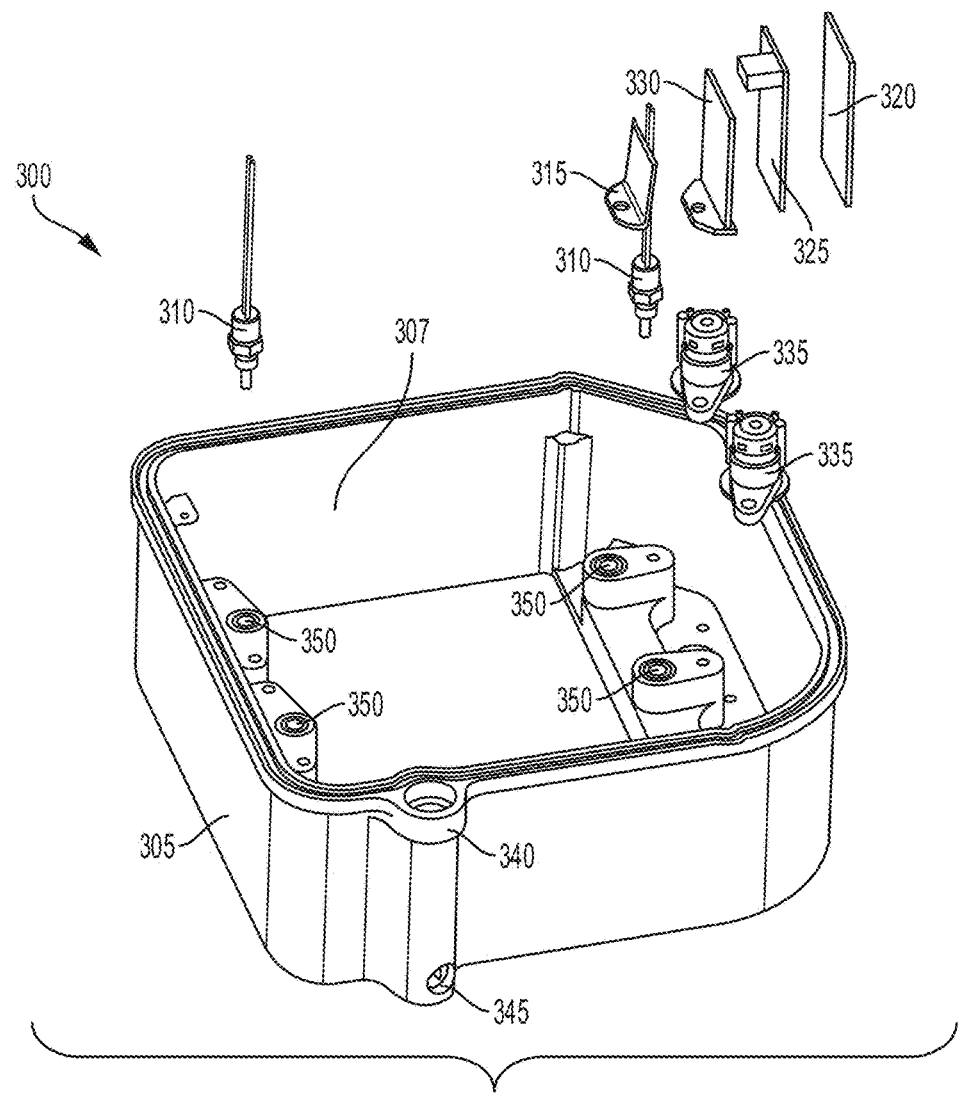
FIG. 3 depicts example exploded view of an inverter house assembly of a multiple phase inverter module of a drive unit of an electric vehicle, according to an illustrative implementation.

FIG. 3, among others, depicts an inverter housing assembly 300. The inverter housing assembly 300 can correspond to a base unit or base component for an inverter module (e.g., inverter module 400 of FIG. 4). For example, each of the different components of an inverter housing 300 can be disposed within the inverter housing assembly 300 to provide a compact inverter module. The inverter housing assembly 300 can be formed having a rectangular shape, square shape, octagonal shape, or circular shape. The particular shape or dimensions of the inverter housing assembly 300 can be selected based at least in part on the shape and dimensions of the power module 100 or the shape and dimensions of a space within a drive train unit of an electric vehicle that the inverter housing assembly 300 is to be disposed within. The inverter housing assembly 300 can have a length in a range from 270 mm to 320 mm (e.g., 280 mm). The inverter housing assembly 300 can have a width in a range from 280 mm to 360 mm (e.g., 290 mm). The inverter housing assembly 300 can have a height in a range from 120 mm to 132 mm (e.g., 127 mm). The dimensions and size of the inverter housing assembly 300 described herein can vary within or outside these ranges.

The inverter housing assembly 300 can include an inverter housing 305. The inverter housing 305 can house one or more power modules 100 of FIG. 1 to form an inverter module of a drive train unit of an electric vehicle. For example, the inverter housing 305 can house three single phase power modules 100 of FIG. 1 to form a three phase inverter module of a drive train unit of an electric vehicle. The inverter housing 305 can form the outer surface or shell of the inverter housing assembly 300. The inverter housing 305 can include or define an inner region 307 that components of an inverter module are disposed within or submerged within. For example, the inverter housing 305 can contain, house or define an inner region 307 that houses a coolant temperature sensor (e.g., coolant temperature sensor 310), a spring clip (e.g., spring clip 315), a thermal pad (e.g., thermal pad 320), an active discharge board (e.g., active discharge board 325), a plastic holder (e.g., plastic holder 330) and high voltage connectors (e.g., high voltage connectors 335). The inverter housing 305 can be formed having a rectangular shape, square shape, octagonal shape, or circular shape. The shape and dimensions of the inverter housing 305 can be selected based in part on the shape and dimensions of the power modules 100 to be disposed within the respective inverter housing 305. The inverter housing 305 can have a length in a range from 270 mm to 290 mm (e.g., 280 mm). The inverter housing 305 can have a width in a range from 280 mm to 300 mm (e.g., 290 mm). The inverter housing 305 can have a height in a range from 120 mm to 132 mm (e.g., 127 mm). The dimensions and size of the inverter housing 305 described herein can vary within or outside these ranges.

The inverter housing assembly 300 can include a coolant temperature sensor 310. The coolant temperature sensor 310 can be positioned to measure a temperature within the inner region 307 of the inverter housing assembly 300. For example, the coolant temperature sensor 310 can measure a temperature of coolant fluid as it is provided to or removed from the inverter housing assembly 300. The inverter housing assembly 300 can include a single coolant temperature sensor 310 or multiple coolant temperature sensors 310. The coolant temperature sensor 310 can be disposed adjacent to, proximate to, or within a predetermined distance (e.g., less than 1 mm) from an inlet coolant manifold to measure a temperature of coolant fluid provided to the inverter housing assembly 300 or an outlet coolant manifold to measure a temperature of coolant fluid released from the inverter housing assembly 300. For example, the inverter housing 305 can include at least two coolant temperature sensors 310 with a first coolant temperature sensor 310 coupled with or disposed at an inlet of the inverter housing 305 and a second coolant temperature sensor 310 coupled with or disposed at an outlet of the inverter housing 305. The coolant temperature sensor 310 can include a temperature sensor. The coolant temperature sensor 310 can measure, record and transmit temperature data corresponding to cooling (e.g., active cooling) or coolant flow within the inverter housing 305. For example, the coolant temperature sensor 310 can provide temperature data (e.g., temperature readings) corresponding to coolant fluid as it is provided to or removed from the inverter housing assembly 300.

The inverter housing assembly 300 can include a spring clip 315. The spring clip 315 can include a clip or a fastener. The spring clip 315 can include metal material, plastic material, or alloy material. The spring clip 315 can couple different components disposed within the inverter housing assembly 300 together. The spring clip 315 can couple with an active discharge board (e.g., active discharge board 325) to couple different components disposed within the inverter housing assembly 300 together. For example, the spring clip 315 can couple at least one of the coolant temperature sensors 310 and a plastic holder (e.g., plastic holder 330) with an active discharge board (e.g., active discharge board 325) such that the at least one of the coolant temperature sensors 310 and the plastic holder 330 are disposed between the spring clip 315 and the active discharge board.

The inverter housing assembly 300 can include a thermal pad 320. The thermal pad 320 can include non-conductive material, such as but not limited to, aluminum oxide, aluminum nitride, silicon material or a silicon aluminum blend material. The thermal pad 320 can provide cooling, heat dissipation, or heat rejection for different components disposed within the inverter housing assembly 300. For example, the thermal pad 320 can include conductive material and can aid in the conduction of heat away from components within the inverter housing 305 that are being cooled, such as but not limited to, for cooling active resistors of a power module 100 or inverter module 400. The thermal pad 320 can be coupled with or in contact with an active discharge board (e.g., active discharge board 325) to provide cooling, heat dissipation, or heat rejection for the active discharge board. The thermal pad 320 can be couple with the active discharge board to provide heat dissipation or heat rejection for heat generated at or by the active discharge board.

The inverter housing assembly 300 can include an active discharge board 325. The active discharge board 325 can include an active discharge circuit or a circuit board. For example, the active discharge board 325 can include a circuit having at least one capacitor, at least one resistor, or at least one switching element. The active discharge board 325 can discharge a voltage or a current during a shutdown of one or more power modules 100 of an inverter module (e.g., inverter module 400 of FIG. 4). The active discharge board 325 can be disposed between the thermal pad 320 and a plastic holder (e.g., plastic holder 330).

The inverter housing assembly 300 can include a holder 330. The holder 330 can include plastic material. The holder 330 can be disposed between a coolant temperature sensor 310 and the active discharge board 325. The holder 330 can be positioned to couple different components disposed within the inverter housing assembly 300 together. For example, the holder 330 can couple the spring clip 315 with at least one coolant temperature sensor 310. The holder 330 can couple the thermal pad 320 with the active discharge board 325.

The inverter housing 300 can include a high voltage (HV) connector 335. The inverter housing 300 can include a single HV connector 335 or multiple HV connectors 335 (e.g., two HV connectors). Each HV connector 335 can couple with at least one input terminal of the inverter housing 305. The HV connector 335 can include a DC connector, a wire, or electrical connection to provide voltage to one or more electrical components within an inverter module. For example, the HV connector 335 can provide a voltage in a first voltage range to the inverter module assembly 300. For example, the HV connector 335 can provide a voltage in a range from 0 V to 1000 V. The HV connector 335 can couple with at least one positive bus bar or at least one negative bus bar to provide a single phase voltage to each of the power modules 100 through their respective positive inputs 152 or negative inputs 154. For example, and as depicted in FIG. 3, the inverter housing assembly 300 can include a positive HV connector 335 and a negative HV connector 335. The positive HV connector 335 can couple with a positive bus bar (not shown) that couples with positive inputs 152 of power modules 100 disposed within the inverter housing assembly 300. The negative HV connector 335 can couple with a negative bus bar (not shown) that couples with negative inputs 154 of power modules 100 disposed within the inverter housing assembly 300.

The inverter housing assembly 300 can include input connection 340. For example, the input connection 340 can include a coolant input hose connection that can receive a hose, tube, or conduit such that coolant can be provided to the inverter housing assembly 305. For example, the input connection 340 can include an orifice, a hole, or a threaded hole to receive or couple with a hose, tube or conduit. The inverter housing assembly 300 can include an output connection 345 (or an output). The output connection 345 can include a coolant output hose connection that can receive a hose, tube, or conduit such that coolant can be removed from the inverter housing assembly 305. For example, the output connection 345 can include an orifice, a hole, or a threaded hole to receive or couple with a hose, tube or conduit. The output connection 345 can include an output hose barb and can receive or couple with a hose, tube, or conduit to release coolant from the inverter housing assembly 300.

The inverter housing assembly 300 can include one or more connection points 350. The connection points 350 can include threaded inserts, holes, or receptacles. The connection points 350 can be formed on various surface of the inverter housing 305. For example, the connection points 350 can be formed in the inner region 307 of the inverter housing 305. The connection points 350 can be formed along one or more edge or side surfaces of the inverter housing 305. The connection points 350 can be used to couple one or more power modules 100 within the inverter housing 305. For example, a three phase power module (e.g., three phase power module 405 of FIG. 4) can couple with the inverter housing 305 using one or more of the connection points 350. The connection points 350 can couple the inverter housing 305 within a drive train unit of an electric vehicle. The connection points 350 can couple a lid or top surface with the inverter housing 305 to seal the inverter housing assembly 300. For example, the connection points 350 can receive a fastener (e.g., screw, bolt) to couple a lid or top surface with the inverter housing 305 to seal the inverter housing assembly 300.

Figure 4:
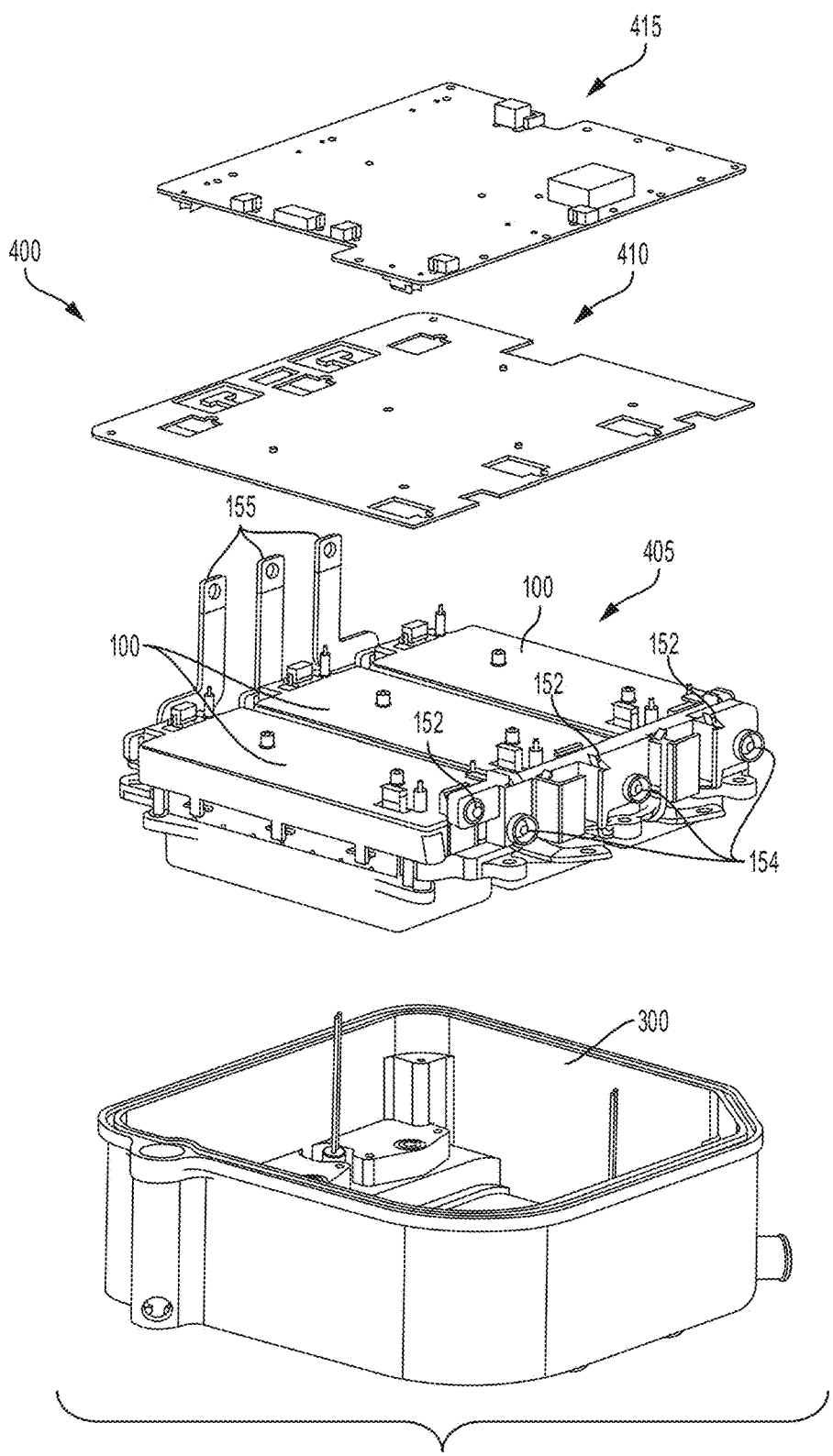
FIG. 4 depicts an example exploded view of a multiple phase inverter module of a drive unit of an electric vehicle, according to an illustrative implementation.

FIG. 4, among others, depicts an inverter module 400. The inverter module 400 can be formed having three power modules 100 coupled or arranged in a triplet configuration for electric vehicle drive systems. The inverter module 400 can couple with a drive train unit of the electric vehicle and can provide single phase voltage or multiple phase voltages (e.g., three phase voltages) to the drive train unit. For example, each of the power modules 100 can generate a single phase voltage and thus, the three power modules 100 coupled or arranged in a triplet configuration can provide three phase voltages.

The inverter module 400 can be formed having a rectangular shape, square shape, octagonal shape, or circular shape. The particular shape or dimensions of the inverter module 400 can be selected based at least in part on the shape and dimensions of the power modules 100 disposed therein or the shape and dimensions of a space within a drive train unit of an electric vehicle that the inverter module 400 is to be disposed within. The inverter module 400 can have a length in a range from 270 mm to 290 mm (e.g., 280 mm). The inverter module 400 can have a width in a range from 280 mm to 300 mm (e.g., 290 mm). The inverter module 400 can have a height in a range from 120 mm to 132 mm (e.g., 127 mm). The dimensions and size of the inverter module 400 described herein can vary within or outside these ranges.

The inverter module 400 can include the inverter housing assembly 300 of FIG. 3. The inverter module 400 can include a three phase power module 405. The three phase power module 405 can be disposed within the inverter housing assembly 300. The three phase module 405 can include multiple power modules 100. For example, the three phase power module 405 can include three single phase power modules 100 to provide and form the three phase power module 405. The power modules 100 can be arranged in a triplet configuration such that each of a first, second and third power modules 100 are positioned adjacent to each other in the triplet configuration having each of their respective positive inputs 152 and negative inputs 154 aligned with each other, and their respective output terminals 155 aligned with each other. For example, each of the positive input terminals 152 of the first, second, third power modules 100 can be positioned such that they are at the same level or same height with respect to side surfaces of the power modules 100. Each of the first, second, third negative input terminals 154 of the first, second, third power modules 100 can be positioned such that they are at the same level or same height with respect to side surfaces of the power modules 100. The outputs 155 of the each of the first, second and third power modules 100 can be positioned such that they are at the same level or same height with respect to side surfaces of the power modules 100. The arrangement of the first, second and third power modules 100 in the triplet configuration can provide a compact dimensions for the three phase power module 405 housing each of the first, second and third power modules 100. For example, the alignment of the input terminals 152, 154 and output terminals 155 can allow one or more bus-bars coupled to each of the power modules 100 to be disposed adjacent and parallel to each other to provide a compact inverter module 400. The power modules 100 can be formed to be modular units having similar shapes, sizes, and dimensions such that they can interchangeable within the three phase power module 405 and inverter module 400. Thus, individual power modules 100 can be replaced, serviced or otherwise repaired without replacing an entire inverter module 400. Each of the power modules 100 in a common inverter module 400 may have the same shape, size, and dimensions or one or more of the half-bridge modules 305 in a common inverter module 400 may have a different shape, size, or dimensions.

The three phase power module 405 can include a first surface (e.g., top surface) and a second surface (e.g., bottom surface). The three phase power module 405 can be disposed within the inner region 307 of the inverter housing assembly 300 such that the second surface can be in contact with, disposed proximate to, or adjacent to an inner surface of the inverter housing assembly 300 (e.g., disposed on top of the inner surface of the inverter housing assembly 300). The three phase power module 405 can be disposed within an inner region of the inverter housing assembly 300 to complete a cooling channel and provide structural rigidity to each of the power modules 100 of the three phase power module 405.

The inverter module 400 can include an electromagnetic interference (EMI) shield 410. The EMI shield 410 may include a current sensor core. The EMI shield 410 can include a first surface (e.g., top surface) and a second surface (e.g., bottom surface). The second surface of the EMI shield 410 can be coupled with, disposed over or in contact with the first surface of the three phase power module 405. For example, the EMI shield 410 can be coupled with, disposed over, or in contact with the first surfaces of each of the power modules 100 forming the three phase power module 405.

The inverter module 400 can include a control and high voltage circuit board 415 (which can also be referred to herein as a control board). The control board 415 can include a first surface (e.g., top surface) and a second surface (e.g., bottom surface). The second surface of the control board 415 can be coupled with, disposed over or in contact with the first surface of the EMI shield 410. The control board 415 can include multiple floating connectors or receiving components can couple with connectors of gate drive PCB's 160 of the three phase power module 405. For example, the control board 415 can couple with or plug into six floating connectors on the gate drive PCB's 160 of each of the power modules 100 forming the three phase power module 405. Each of the three phase power module 405, the EMI shield 410 and the control board 415 can be disposed within an inner region defined by the inverter housing assembly 300 such that side portions or side edges of the inverter housing assembly 300 extend around or otherwise about each of the three phase power module 405, the EMI shield 410 and the control board 415 when the three phase power module 405, the EMI shield 410 and the control board 415 are disposed within the inverter housing assembly 300.

One or more wires or wire harnesses can be coupled with the control board 415 to connect circuitry, such as but not limited to, control circuitry to the control board 415. The wire or wire harnesses may provide a signal path for the control board to transmit control signals or receive control signals or other forms of signal feedback from components of the inverter module 400 or control circuits external to the inverter module 400. When the inverter module 400 is assembled, the inverter module 400 can be coupled with, disposed within or mounted to a drive unit of an electric vehicle.

In operation, the inverter module 400 can receive high voltage direct current from a battery system or a junction box, and convert the high voltage to a multiple phase alternating current (AC) to drive an AC motor. For example, the inverter module 400 can receive high voltage direct current from a battery system or a junction box, and convert the high voltage to a three phase alternating current (AC) to a three phase AC motor. The transistors 125 in each of the power modules 100 forming the three phase power module 405 can convert the direct current to alternating current power (e.g., convert DC to AC power). The inverter module 400 can provide thermal dissipation to the transistors 125 and high voltage within a predetermined range (e.g., a required or desired voltage for a particular application of the inverter module 400) while reducing or otherwise providing low EMI noise. The modular design of the inverter modules 400 described herein can provide high power density, low EMI noise, low cost, ease of manufacturing, a reduce waste or scrap rate during production, effective heat dissipation and provide high voltage insulation.

Figure 5:
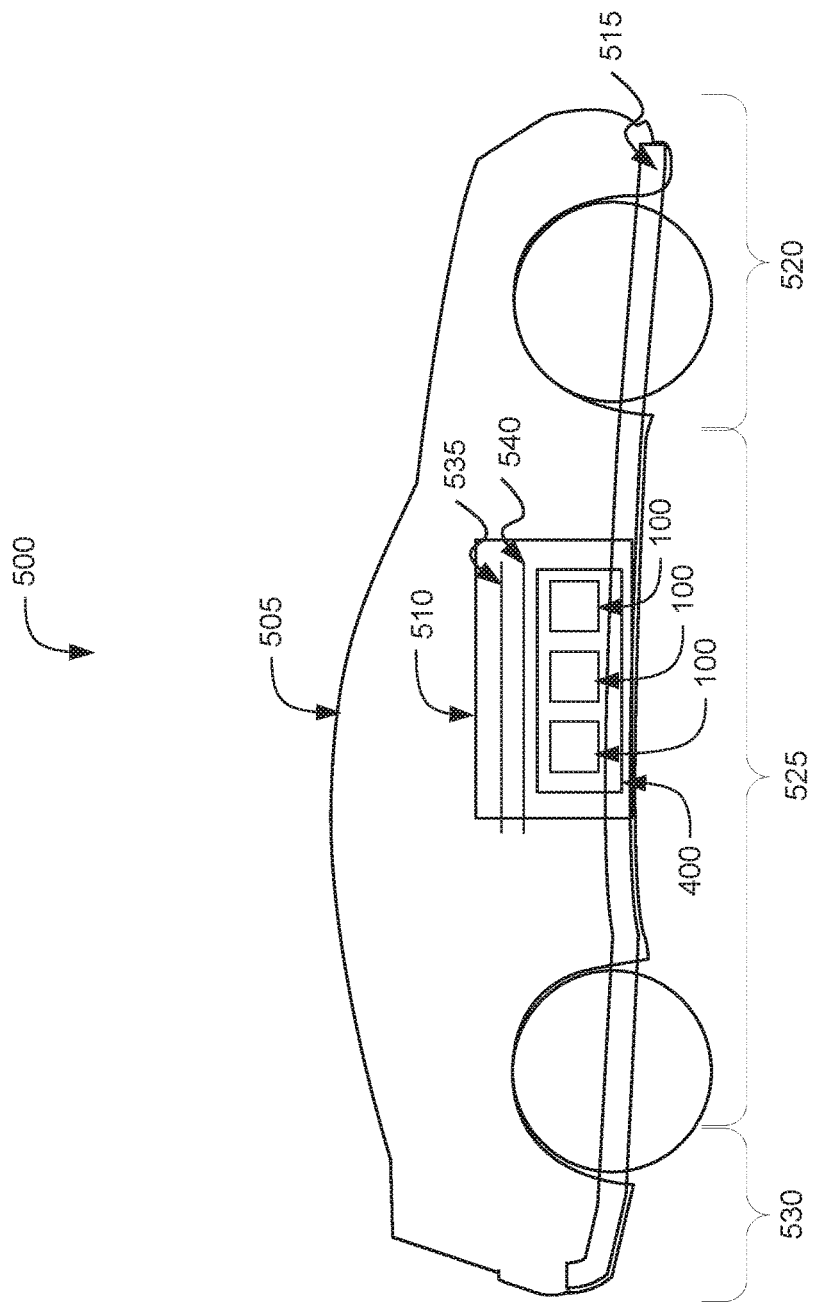
FIG. 5 is a block diagram depicting a cross-sectional view of an example electric vehicle installed with a battery pack.

FIG. 5 depicts an example cross-section view 500 of an electric vehicle 505 installed with a battery pack 510. The battery pack 510 can include an inverter module 400 having three power modules 100 to provide three phase power for the electric vehicle 505 through the battery pack 510. For example, each of the power modules 100 can generate a single phase power and can be coupled in a triplet configuration within the inverter module 400 to generate three phase power for the electric vehicle 505. The battery pack 510 can correspond to a drive train unit 510 of the electric vehicle 505. For example, the battery pack 510 can be disposed within or be a component of a drive train unit 510. The drive train unit 510 (and the battery pack 510) can provide power to the electric vehicle 505. For example, the drive train unit 510 may include components of the electric vehicle 505 that generate or provide power to drive the wheels or move the electric vehicle 505. The drive train unit 510 can be a component of an electric vehicle drive system. The electric vehicle drive system can transmit or provide power to different components of the electric vehicle 505. For example, the electric vehicle drive train system can transmit power from the battery pack 510 or drive train unit 510 to an axle or wheels of the electric vehicle 505.

The electric vehicle 505 can include an autonomous, semi-autonomous, or non-autonomous human operated vehicle. The electric vehicle 505 can include a hybrid vehicle that operates from on-board electric sources and from gasoline or other power sources. The electric vehicle 505 can include automobiles, cars, trucks, passenger vehicles, industrial vehicles, motorcycles, and other transport vehicles. The electric vehicle 505 can include a chassis 515 (sometimes referred to herein as a frame, internal frame, or support structure). The chassis 515 can support various components of the electric vehicle 505. The chassis 515 can span a front portion 520 (sometimes referred to herein a hood or bonnet portion), a body portion 525, and a rear portion 530 (sometimes referred to herein as a trunk portion) of the electric vehicle 505. The front portion 520 can include the portion of the electric vehicle 505 from the front bumper to the front wheel well of the electric vehicle 505. The body portion 525 can include the portion of the electric vehicle 505 from the front wheel well to the back wheel well of the electric vehicle 505. The rear portion 530 can include the portion of the electric vehicle 505 from the back wheel well to the back bumper of the electric vehicle 505.

The battery pack 510 that includes the inverter module 400 having the three power modules 100 can be installed or placed within the electric vehicle 505. The battery pack 510 can include or couple with a power converter component. For example, the power converter component can include the inverter module 400 having three phase power module 405. The battery pack 510 can be installed on the chassis 515 of the electric vehicle 505 within the front portion 520, the body portion 525 (as depicted in the example of FIG. 5), or the rear portion 530. The battery pack 510 can couple with a first bus bar 535 and a second bus bar 540 that are connected or otherwise electrically coupled with other electrical components of the electric vehicle 505 to provide electrical power from the battery pack 510. For example, each of the power modules 100 can couple with the first bus-bar 535 and the second bus bar 540 to provide electrical power from the battery pack 510 to other electrical components of the electric vehicle 505.

Figure 6:
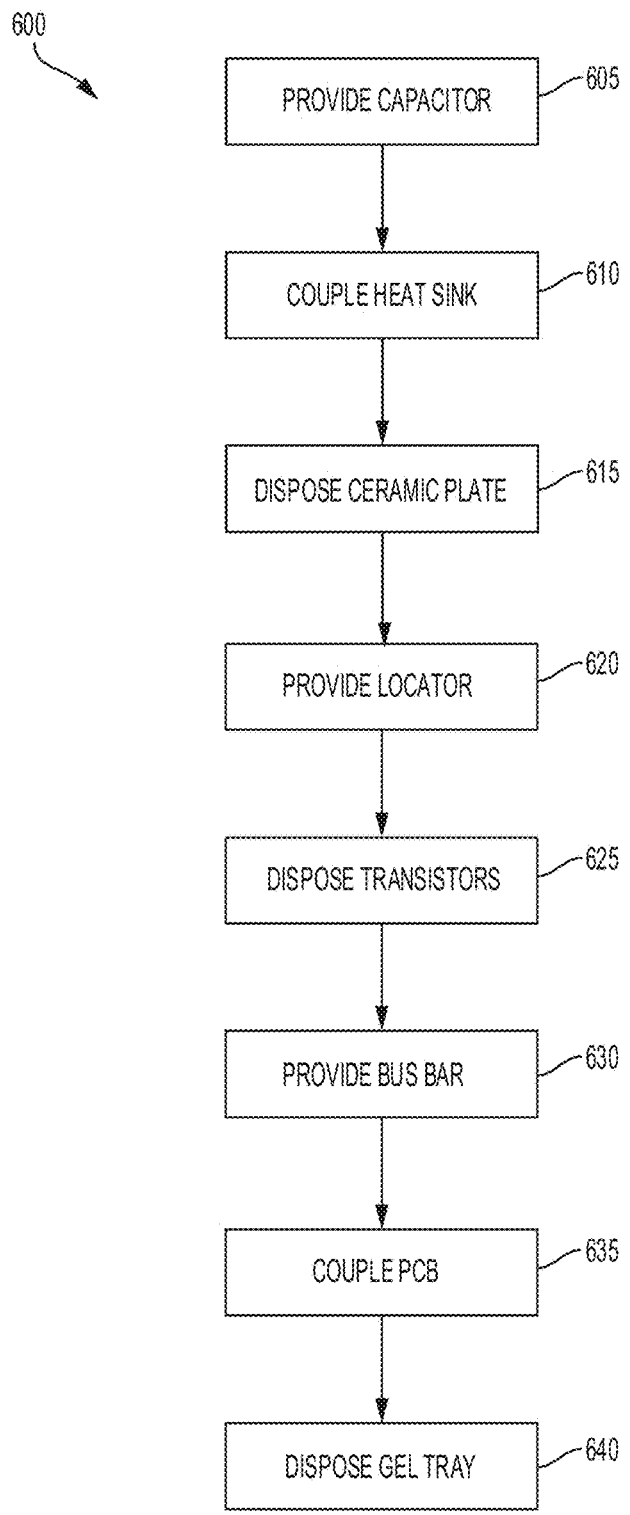
FIG. 6 is a flow diagram depicting an example method of providing battery cells for battery packs for electric vehicles.

FIG. 6, among others, depicts a flow diagram of a method 600 for providing an inverter module 400 to power an electric vehicle 505. The inverter module 400 can include a single power module 100 or multiple power modules 100 to provide power for the various electrical components of the electric vehicle 505. The method 600 can include providing a capacitor 105 (ACT 605). The capacitor 105 can be disposed within an inverter module housing assembly 300. The capacitor 105 can form the base or the bottom portion of a power module 100 of the inverter module 400. The capacitor 105 can be formed having positive terminals 107 and negative terminal 109. The positive terminals 107 and the negative terminals 109 can be positioned such that they extend perpendicular with respect to a first surface (e.g., top surface) of the capacitor 105. Providing the capacitor 105 can include disposing a divider 110 between the positive terminals 107 and the negative terminals 109 to electrically insulate the positive terminals 107 from the negative terminals 109. One or more capacitor elements (not shown) can be disposed within the capacitor 105. For example, a single capacitor film roll or multiple capacitor film rolls (e.g., three to four capacitor film rolls) can be disposed within the capacitor 105. One or more tabs can couple the capacitor film rolls with the positive terminals 107 and the negative terminals 109.

The method 600 can include coupling a heat sink 115 (ACT 610). For example, the heat sink 115 can couple with the capacitor 105. A second surface (e.g., bottom surface) of the heat sink 115 can be disposed over the first surface of the capacitor 105. One or more mounting feet formed on the second surface of the heat sink 115 can couple with one or more mounting holes formed on the capacitor 105 to couple the heat sink 115 with the capacitor 105. The heat sink 115 can be positioned such that an aperture 117 (e.g., open inner region) of the heat sink 115 surrounds or is disposed about the positive terminals 107 and the negative terminals 109 of the capacitor 105. For example, the heat sink 115 can be positioned to provide active cooling to components and electronics (e.g., capacitor 105, transistors 125) disposed proximate to surfaces of the heat sink 115, such as but not limited to, the positive terminals 107 and the negative terminals 109 of the capacitor 105. The positive terminals 107 and the negative terminals 109 can extend through the aperture 117 such that the positive terminals 107 and the negative terminals 109 are surrounded on multiple sides by surfaces of the heat sink 115. The heat sink 115 can provide active cooling to the first surface of the capacitor 105 and the positive terminals 107 and the negative terminals 109 of the capacitor 105.

The method 600 can include disposing a ceramic plate 120 (ACT 615). At least one ceramic plate 120 can be disposed over the first surface of the heat sink 115. For example, a single ceramic plate 120 or multiple ceramic plates 120 (e.g., two or more) can be disposed over the first surface of the heat sink 115. For example, a first ceramic plate 120 can be disposed over a first portion of the first surface of the heat sink 115 and a second ceramic plate 120 can be disposed over a second portion of the first surface of the heat sink 115. The ceramic plates 120 can be formed using ceramic based material. The ceramic plates 120 can be positioned to electrically insulate the heat sink 115 from transistors (e.g., transistors 125) disposed within the power module 100. For example, the ceramic plates 120 can positioned over a top surface of the heat sink 115 to prevent a short circuit condition between the heat sink 115 and the transistors (e.g., transistors 125) disposed within the power module 100.

The method 600 can include providing a locator 140 (ACT 620). The locator 140 can be formed using non-conductive material or plastic material. The locator 140 can be disposed over a first surface of the ceramic plates 120. A plurality of slots 142 can be formed in the locator 140. For example, a first row of slots 142 along a first side of the locator 140 and a second row of slots 142 can be formed along a second side of the locator 140. The rows of slots 142 can include the same number of slots 142 or a different number of slots 142. The locator 140 can be positioned such that at least one ceramic plate 120 is disposed under the respective row of slots 142. For example, the first row of slots 142 can be aligned with the first ceramic plate 120 and the second row of slots 142 can be aligned with the second ceramic plate 120.

The method 600 can include disposing one or more transistors 125 (ACT 625). At least one transistor 125 can be disposed in at least one of the slots 142 of the locator 140. For example, each of the transistors 125 can be disposed in or coupled with at least one of the slots 142 of the locator 140. Thus, the transistors 125 and the locator 140 can be disposed over first surfaces of the ceramic plates 120. The transistors 125 can be organized or disposed based on the arrangement of the slots 142 of the locator 140. For example, the transistors 125 can be arranged in a first row and a second row corresponding to the first row of slots 142 and the second row of slots 142. Each of the transistors 125 can include a plurality of leads 130. The leads 130 can be bent, shaped or otherwise manipulated to couple with a respective one or more components (e.g., gate drive PCB 160, capacitor 105) within the power module 100. For example, the leads 130 can be formed or positioned such that they extend perpendicular with respect to a first surface (e.g., top surface) of the transistors 125. For example, the leads 130 can be formed such that they have a bent shape and extend up with respect to a first surface (e.g., top surface) of the transistors 125 to couple with other components of the power module 100 (e.g., laminated bus bar 150, gate drive PCB 160). Disposing the transistors 125 can include spacing the transistors 125 with respect to each other with a center to center spacing in a range from 15 mm to 20 mm (e.g., 17.5 mm).

The method 600 can include providing a bus bar 150 (ACT 630). For example, at least one laminated bus bar 150 can be disposed within the power module 100. The laminated bus bar 150 can be disposed over a first surface of the locator 140 and the plurality of transistors 125. For example, the second surface of the laminated bus bar 150 can be disposed over or in contact with the first surface of the locator 140 and portions of the first surface of the transistors 125 disposed in the slots 142 of the locator 140. The leads 130 of the transistors 125 can couple with portions of the laminated bus bar 150. For example, the laminated bus bar 150 can include a plurality of leads 157. Each of the plurality of leads 157 of the laminated bus bar 150 can couple with at least one lead 130 of the plurality of transistors 125.

Providing the bus bar 150 can include forming at least two input terminals 152, 154 (e.g., positive input terminal and negative input terminal) at or along a first side or first edge of the laminated bus bar 150. Providing the bus bar 150 can include forming an output terminal 155 at a second, different side or second, different edge (as compared to the first side or first edge) of the laminated bus bar 150. For example, the two input terminals 152, 154 can be formed at an opposite or opposing side as compared to the output terminal 155. The first and second input terminals 152, 154 can be formed using conductive material, such as but not limited to copper. The output terminal 155 can be formed using conductive material, such as but not limited to copper. The first and second input terminals 152, 154 can be formed in a variety of different shapes to accommodate coupling with an inverter bus bar (e.g., positive bus bar, negative bus bar). For example, the first and second input terminals 152, 154 can be formed having a straight shape, or a curved or bent shape. The first input terminal 152 can be positioned to couple with a positive bus bar to receive a positive voltage and provide the positive voltage to the power module 100. The second input terminal 154 can be positioned to couple with a negative bus-bar (not shown) to receive a negative voltage and provide the negative voltage to the power module 100. For example, the first input terminal 152 can be formed at a different level or height with respect to the side surface of the laminated bus bar 150 as compared with the second input terminal 154. The first input terminal 152 can be formed at a first level or first height and the second input terminal 154 can be formed at a second level or second height. The first level or first height can be greater than the second level or the second height. The first level or first height can be less than the second level or the second height. The output terminal 155 can be formed having a straight shape, or a curved or bent shape. The output terminal 155 can be positioned to couple with a phase bus-bar (not shown) to provide power generated by the power module 100 to other electrical components of an electric vehicle 505.

The method 600 can include coupling a PCB 160 (ACT 635). For example, a gate drive PCB 160 can be disposed over a first surface of the laminated bus bar 150. The gate drive PCB 160 can include control electronics and can generate and provide control signals to the transistors 125. For example, a second surface (e.g., bottom surface) of the gate drive PCB 160 can be disposed over or in contact with the first surface (e.g., top surface) of the laminated bus bar 150 such that the leads 130 of the transistors 125 can extend through the locator 140 and the laminated bus bar 150 to couple with a portion or surface of the gate drive PCB 160. The gate drive PCB 160 can generate control signals, for example, to turn one or more of transistors 125 on or off, open or close.

The method 600 can include disposing a gel tray 165 (ACT 640). For example, a gel tray 165 can be formed using poly carbon material, or other forms of high temperature plastic. The gel tray 165 can be formed having an inner region that covers, submerges, or can be disposed about multiple components of the power module 100. One or more fasteners 167 can couple the gel tray 165 with the capacitor 105. The gel tray 165 can be disposed over a first surface of the gate drive PCB 160. The inner region can have the gate drive PCB 160, the laminated bus bar 150, the plurality of transistors 125, the locator 140, the first ceramic plate 120, the second ceramic plate 120 and the heat sink 115 disposed therein.

One or more capacitive orifices 170 can be formed on at least one side surface of the gel tray 165. For example, the capacitive orifices 170 can be formed as a hole or an access point to couple a power supply (e.g., DC power supply) to the power module 100. The capacitive orifices 170 can be used as inputs or outputs for the power module 100. A first capacitive orifice 170 can be formed that couples the first input terminal 152 of the laminated bus bar 150 with a positive bus bar to provide a positive power supply to the power module 100. A second capacitive orifice 170 can be formed that couples the second input terminal 154 of the laminated bus bar 150 with a negative bus bar to provide a negative power supply to the power module 100. A third capacitive orifice 170 can be formed that couples the output terminal 155 of the laminated bus bar 150 with a phase bus bar to provide an output voltage generated by the power module 100 to other components of an electric vehicle.

An inverter module 400 can be provided to house or contain the power module 100 or multiple power modules 100. For example, an inverter housing assembly 300 can be provided defining an inner region 307 of the inverter module 400. Providing the power module 100 can include disposing the power module 100 within the inner region 307 of the inverter housing assembly 300. For example, a single power module 100 can be disposed within the inner region 307 of the inverter housing assembly 300 or multiple power modules 100 can be disposed within the inner region 307 of the inverter housing assembly 300. For example, three power modules 100 can be disposed within the inner region 307 of the inverter housing assembly 300 to form a three phase power module 405 of an inverter module 400. An electromagnetic interference shield 410 can be disposed over first surfaces of the multiple power modules 100 or the single power module 100. The electromagnetic interference shield 410 can be disposed within the inner region 307. A control board 415 can be disposed over a first surface of the electromagnetic interference shield 410. The control board 415 can be disposed within the inner region 307.

To couple the power modules 100 together, a subassembly 200 can couple with side surfaces of the power modules 100. For example, the subassembly 200 can couple with the power modules 100 to transfer direct current to the power module 100 through one or more conducting paths formed by the positive bus bar 215 and the negative bus bars 220 of the subassembly 200. The subassembly 200 can be formed using a holder 240. The holder 240 can be provided or positioned proximate (e.g., in contact, less than 0.5 mm) to a side surface of the power module 100. A positive DC bus bar 215 can couple with the side surface of the power modules 100 using the holder 240. A negative DC bus bar 220 can couple with the side surface of the power module 100 using the holder 240. Forming the subassembly 200 can include coupling a positive Y-capacitor bus bar 225 with the side surface of the power module using the holder 240. The positive Y-capacitor bus bar 225 can include a first positive portion extending along a first side surface of the holder 240 and a second positive portion extending along a second side surface of the holder 240. For example, the positive Y-capacitor bus bar 225 can be positioned such that it wraps around at least one surface of the holder 240 (e.g., clips onto a surface of the holder 240). Forming the subassembly 200 can include coupling a negative Y-capacitor bus bar 230 with the side surface of the power module using the holder 240. The negative Y-capacitor bus bar 230 can have a first negative portion extending along a first side surface of the holder 240 and a second negative portion extending along a second side surface of the holder 240. For example, the negative Y-capacitor bus bar 230 can be positioned such that it wraps around at least one surface of the holder 240 (e.g., clips onto a surface of the holder 240).

The subassembly 200 can couple with a single power module 100 or multiple power modules 100. The subassembly 200 can be formed having one or more positive input orifices 205 to couple with positive inputs 152 of each power module 100 and one or more negative input orifices 210 to couple with negative inputs 154 of each power module 100. For example, the subassembly 200 can be formed having three positive input orifices 205 and three negative input orifices 210. Thus, the subassembly 200 can transfer direct current to three power modules 100 coupled in a triplet configuration to form a three phase power module 405 of the inverter module 400.

The inverter module 400 can be formed using components, such as transistors 125, to provide more design control for every aspect of the inverter module packaging. For example, the inverter module 400 having multiple power module 100 components can be adapted for a variety of different inverter applications, such as for a drive train unit of an electric vehicle drive system (e.g., electric vehicle 505 of FIG. 5). The inverter module 400 can be designed such that the sub-components can be assembled in a top down fashion or assembled individually to provide for streamlined installation and a simpler manufacturing process as compared to other inverter systems of electric vehicles. For example, the components of the inverter modules 400 described herein can be installed in a vertical direction. As each phase of the inverter module 400 corresponds to at least one power module 100 and each power module 100 can be modular, the respective power modules 100 can be produced and tested before moving onto its next step of assembly.

The individual sub systems, such as a power module 100 of the inverter module 400, can be formed to provide a compact design. Thus, when multiple power modules 100 are coupled with each other or otherwise disposed to form a three phase power module 405, the overall inverter module 400 can have a compact design and maintain clearance for tolerance and electrical insulation. The inverter modules as described herein include a modular design having one or more single phase power modules 100 and thus, can be designed for a variety of different applications, including for different phase or voltage applications. For example, the inverter modules 400 can be used for three phase inverters and three phase inverter applications. The inverter modules 400 can be adopted for multiple phase inverters such as a two phase inverters or more than three phase inverters and two phase inverter applications or more than three phase inverter applications.

The modular design can provide for lower scrap rate in production since, for example, one-third of other inverter system may needs to be removed if there is problem in quality check step. The inverter modules 400 can reduce or have less EMI noise as compared to other inverter systems of electric vehicles. For example, the modular design of the inverter modules 400 described here can provide or create effective heat dissipation for transistors 125, discharge resistors, or capacitors 185 forming the respective power modules 100 via a heat sink 115 to keep these components in their intended operating range.

The packaging of the transistors 125, laminated bus bar 150, positive DC link bus bar 215 (described below with respect to FIG. 2), negative DC link bus bar 220, positive Y-capacitor bus bar 225, negative Y-capacitor bus bar 230, ground Y-capacitor bus bar 235, and capacitor 105 can be a challenging problem when designing and creating an inverter module. The location of each of the components relative to each other can be the key or otherwise important to provide adequate thermal dissipation and provide reduced or low EMI noise. The inverter module 400 can include at least one heat sink 115 in each of the power modules 100. Positive and negative terminals 107, 109 of the capacitor 105 in each of the power modules 100 can extend through (e.g., come up through, extend down through) an opening, hole or orifice formed in a middle region of the respective heat sink 115 and coupled with (e.g., directly couple with) the leads 130 of the transistors 125. The transistors 125 can be arranged such that they are positioned within a predetermined distance from each other (e.g., positioned next to each other, positioned having side portions in contact with each other, positioned closely to each other) to form a small inductance loop.

As each phase or each power module 100 of the inverter module 400 is modular, a quality check step in assembly line can be performed after each power module 100 is created or after multiple power modules 100 are created. The capacitor 105 can be positioned within the three phase power module 405 and within the inverter module 400 such that each capacitor 105 can be actively cooled by the air in an environment (e.g., outside the inverter module 400) around the inverter module 400, by the coolant inside the heat sink 115 or by a combination of the air in the environment around the inverter module 400 and by the coolant inside the heat sink 115. Thus, the capacitors 185 can operate within a predetermined operating temperature (e.g., ideal operating temperature) of the respective capacitor 105. The predetermined operating temperature can be selected based at least in part on a particular application of the inverter module 400. For example, the predetermined operating temperature can range from −40° C. to 85° C.

Figure 7:
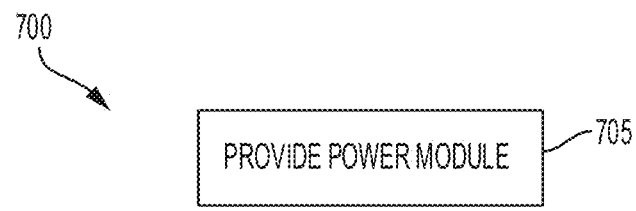
FIG. 7 is a flow diagram depicting an example method of providing battery cells for battery packs for electric vehicles.

FIG. 7, among others, depicts a method 700 for providing a power module 100. The power module 100 can couple with one or more other power modules 100 to form an inverter module 400 to power an electric vehicle 505. The method 700 can include providing a power module 100 (ACT 705). The power module 700 can include a capacitor 105. The power module 700 can include a heat sink 115 coupled with a first surface of the capacitor 105. The power module 700 can include a first ceramic plate 120 coupled with a first surface of the heat sink 115. The power module 700 can include a second ceramic plate 120 coupled with the first surface of the heat sink 115. The power module 700 can include a locator 140 having a plurality of slots 142. The power module 700 can include a plurality of transistors 125 disposed within the plurality of slots 142. The locator 140 and the plurality of transistors 125 can be disposed over a first surface of the first ceramic plate 120 and a first surface of the second ceramic plate 120. The power module 700 can include a laminated bus bar 150 disposed over a first surface of the locator 140. The power module 700 can include a gate drive PCB 160 coupled with a first surface of the laminated bus bar 150. The power module 700 can include a dielectric gel tray 165 disposed over a first surface of the gate drive PCB 160.

While acts or operations may be depicted in the drawings or described in a particular order, such operations are not required to be performed in the particular order shown or described, or in sequential order, and all depicted or described operations are not required to be performed. Actions described herein can be performed in different orders.

Having now described some illustrative implementations, it is apparent that the foregoing is illustrative and not limiting, having been presented by way of example. Features that are described herein in the context of separate implementations can also be implemented in combination in a single embodiment or implementation. Features that are described in the context of a single implementation can also be implemented in multiple implementations separately or in various sub-combinations. References to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any act or element may include implementations where the act or element is based at least in part on any act or element.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular can include implementations including a plurality of these elements, and any references in plural to any implementation or element or act herein can include implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation or embodiment, and references to "an implementation," "some implementations," "one implementation" or the like are not necessarily mutually exclusive and are intended to indicate that a particular feature, structure, or characteristic described in connection with the implementation may be included in at least one implementation or embodiment. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of" 'A' and 13' can include only 'A', only 'B', as well as both 'A' and 'B'. Such references used in conjunction with "comprising" or other open terminology can include additional items.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

Modifications of described elements and acts such as variations in sizes, dimensions, structures, shapes and proportions of the various elements, values of parameters, mounting arrangements, use of materials, colors, orientations can occur without materially departing from the teachings and advantages of the subject matter disclosed herein. For example, elements shown as integrally formed can be constructed of multiple parts or elements, the position of elements can be reversed or otherwise varied, and the nature or number of discrete elements or positions can be altered or varied. Other substitutions, modifications, changes and omissions can also be made in the design, operating conditions and arrangement of the disclosed elements and operations without departing from the scope of the present disclosure.

The systems and methods described herein may be embodied in other specific forms without departing from the characteristics thereof. For example the voltage across terminals of battery cells can be greater than 5V. The foregoing implementations are illustrative rather than limiting of the described systems and methods. Scope of the systems and methods described herein is thus indicated by the appended claims, rather than the foregoing description, and changes that come within the meaning and range of equivalency of the claims are embraced therein.

Systems and methods described herein may be embodied in other specific forms without departing from the characteristics thereof. For example, descriptions of positive and negative electrical characteristics may be reversed. For example, elements described as negative elements can instead be configured as positive elements and elements described as positive elements can instead by configured as negative elements. Further relative parallel, perpendicular, vertical or other positioning or orientation descriptions include variations within +/−10% or +/−10 degrees of pure vertical, parallel or perpendicular positioning. References to "approximately," "about" "substantially" or other terms of degree include variations of +/−10% from the given measurement, unit, or range unless explicitly indicated otherwise. Coupled elements can be electrically, mechanically, or physically coupled with one another directly or with intervening elements. Scope of the systems and methods described herein is thus indicated by the appended claims, rather than the foregoing description, and changes that come within the meaning and range of equivalency of the claims are embraced therein.

What is claimed is:

1. An inverter module to power an electric vehicle, comprising:
    a power module, the power module comprising:
        a capacitor;
        a heat sink coupled with a first surface of the capacitor;
        a first ceramic plate coupled with a first surface of the heat sink;
        a second ceramic plate coupled with the first surface of the heat sink;
        a locator having a plurality of slots;
        a plurality of transistors disposed within the plurality of slots;
        the locator and the plurality of transistors disposed over a first surface of the first ceramic plate and a first surface of the second ceramic plate;
        a laminated bus bar disposed over a first surface of the locator;
        a first input terminal disposed at a first side of the laminated bus bar, the first input terminal at a first level with respect to the first side of the laminated bus bar;
        a second input terminal disposed at the first side of the laminated bus bar, the second input terminal at a second level with respect to the first side of the laminated bus bar;
        an output terminal disposed at a second side of the laminated bus bar;
        a gate drive printed circuit board coupled with a first surface of the laminated bus bar; and
        a dielectric gel tray disposed over a first surface of the gate drive printed circuit board.

2. The inverter module of claim 1, comprising:
    the dielectric gel tray defining an inner region;
    the inner region having the gate drive printed circuit board, the laminated bus bar, the plurality of transistors, the locator, the first ceramic plate, the second ceramic plate and the heat sink disposed therein; and the dielectric gel tray coupled with the capacitor through at least one fastener.

3. The inverter module of claim 1, comprising:
at least one clip coupling the plurality of transistors with the plurality of slots of the locator.

4. The inverter module of claim 1, comprising:
a positive DC bus bar coupled with a side surface of the power module through a holder.

5. The inverter module of claim 1, comprising:
a negative DC bus bar coupled with a side surface of the power module through a holder.

6. The inverter module of claim 1, comprising:
a positive Y-capacitor bus bar coupled with a side surface of the power module through a holder; and
the positive Y-capacitor bus bar having a first positive portion extending along a first side surface of the holder and a second positive portion extending along a second side surface of the holder.

7. The inverter module of claim 1, comprising:
a negative Y-capacitor bus bar coupled with a side surface of the power module through a holder; and
the negative Y-capacitor bus bar having a first negative portion extending along a first side surface of the holder and a second negative portion extending along a second side surface of the holder.

8. The inverter module of claim 1, comprising:
a ground Y-capacitor bus bar coupled with a positive DC bus bar of the power module through a holder; and
the ground Y-capacitor bus bar coupled with a first side surface of the holder.

9. The inverter module of claim 1, comprising:
an inverter housing assembly defining an inner region; and
multiple power modules disposed within the inner region.

10. The inverter module of claim 1, comprising:
an electromagnetic interference shield disposed over first surfaces of multiple power modules disposed within an inner region of the inverter module, the electromagnetic interference shield disposed within the inner region; and
a control board disposed over a first surface of the electromagnetic interference shield, the control board disposed within the inner region.

11. The inverter module of claim 1, comprising:
at least one voltage connector disposed within an inner region of the inverter module.

12. The inverter module of claim 1, comprising:
a first temperature sensor disposed adjacent to an inlet of an inverter housing assembly, the first temperature sensor disposed within the inner region; and
a second temperature sensor disposed adjacent to an outlet of the inverter housing assembly, the second temperature sensor disposed within the inner region.

13. The inverter module of claim 1, comprising:
a thermal pad;
a discharge board coupled with the thermal pad;
a holder coupled with the discharge board;
a temperature sensor;
a clip coupled with the temperature sensor, the holder, the discharge board, and the thermal pad; and
the thermal pad, the discharge board, the holder, the temperature sensor and the clip disposed within an inner region of the inverter module.

14. The inverter module of claim 1, comprising:
three power modules coupled in a triplet configuration within the inverter module; and
the inverter module disposed in an electric vehicle;

first input terminals of each of the three power modules disposed at the first level with respect to the first side of the laminated bus bar;
second input terminals of each of the three power modules disposed at the second level with respect to the first side of the laminated bus bar; and
output terminals of each of the three power modules aligned with respect to the second side of the laminated bus bar.

15. A method to provide electrical power via an inverter module to power an electric vehicle, the method comprising:
providing a capacitor;
coupling a heat sink with a first surface of the capacitor;
disposing a first ceramic plate with a first surface of the heat sink;
disposing a second ceramic plate with the first surface of the heat sink;
providing a locator having a plurality of slots;
disposing a plurality of transistors within the plurality of slots, the locator and the plurality of transistors disposed over a first surface of the first ceramic plate and a first surface of the second ceramic plate;
providing a laminated bus bar over a first surface of the locator;
disposing a first input terminal at a first side of the laminated bus bar, the first input terminal at a first level with respect to the first side of the laminated bus bar;
disposed a second input terminal at the first side of the laminated bus bar, the second input terminal at a second level with respect to the first side of the laminated bus bar;
disposing an output terminal at a second side of the laminated bus bar;
coupling a gate drive printed circuit board with a first surface of the laminated bus bar; and
disposing a dielectric gel tray over a first surface of the gate drive printed circuit board.

16. The method of claim 15, comprising:
providing the dielectric gel tray defining an inner region;
disposing each of the gate drive printed circuit board, the laminated bus bar, the plurality of transistors, the locator, the first ceramic plate, the second ceramic plate and the heat sink within an inner region defined by the dielectric gel tray; and
coupling the dielectric gel tray with the capacitor through at least one fastener.

17. The method of claim 15, comprising:
providing a holder proximate to a side surface of the power module;
coupling a positive DC bus bar with the side surface of the power module using the holder; and
coupling a negative DC bus bar coupled with the side surface of the power module using the holder.

18. The method of claim 15, comprising:
providing a holder proximate to a side surface of the power module;
coupling a positive Y-capacitor bus bar with the side surface of the power module using the holder;
the positive Y-capacitor bus bar having a first positive portion extending along a first side surface of the holder and a second positive portion extending along a second side surface of the holder;
coupling a negative Y-capacitor bus bar with the side surface of the power module using the holder; and the negative Y-capacitor bus bar having a first negative portion extending along a first side surface of the holder and a second negative portion extending along a second side surface of the holder.

19. The method of claim 15, comprising:
providing an inverter housing assembly defining an inner region of the inverter module;
disposing multiple power modules within an inner region;
disposing an electromagnetic interference shield over first surfaces of the multiple power modules, the electromagnetic interference shield disposed within the inner region; and
providing a control board over a first surface of the electromagnetic interference shield, the control board disposed within the inner region.

20. An electric vehicle, comprising:
an inverter module to power the electric vehicle, the inverter module comprising:
   a power module, the power module comprising:
     a capacitor;
     a heat sink coupled with a first surface of the capacitor;
     a first ceramic plate coupled with a first surface of the heat sink;
     a second ceramic plate coupled with the first surface of the heat sink;
     a locator having a plurality of slots;
     a plurality of transistors disposed within the plurality of slots;
     the locator and the plurality of transistors disposed over a first surface of the first ceramic plate and a first surface of the second ceramic plate;
     a laminated bus bar disposed over a first surface of the locator;
     a first input terminal disposed at a first side of the laminated bus bar, the first input terminal at a first level with respect to the first side of the laminated bus bar;
     a second input terminal disposed at the first side of the laminated bus bar, the second input terminal at a second level with respect to the first side of the laminated bus bar;
     an output terminal disposed at a second side of the laminated bus bar;
     a gate drive printed circuit board coupled with a first surface of the laminated bus bar; and
     a dielectric gel tray disposed over a first surface of the gate drive printed circuit board.

\* \* \* \* \*